(12) United States Patent
Nagy et al.

(10) Patent No.: US 9,430,749 B2
(45) Date of Patent: Aug. 30, 2016

(54) ARCHITECTURAL PLANNING SYSTEM AND PROCESS THEREFOR

(75) Inventors: Gabor Nagy, Sausalito, CA (US); Jacob William Rigby, West Chazy, NY (US); Jeremiah Benjamin Lee, West Chazy, NY (US); Donghui Wu, Singapore (SG)

(73) Assignee: Haworth, Inc., Holland, MI (US)

( * ) Notice: Subject to any disclaimer, the term of this patent is extended or adjusted under 35 U.S.C. 154(b) by 222 days.

(21) Appl. No.: 13/885,846

(22) PCT Filed: Nov. 17, 2010

(86) PCT No.: PCT/CN2010/001842
§ 371 (c)(1),
(2), (4) Date: May 16, 2013

(87) PCT Pub. No.: WO2012/065281
PCT Pub. Date: May 24, 2012

(65) Prior Publication Data
US 2013/0246108 A1 Sep. 19, 2013

(51) Int. Cl.
*G06Q 10/00* (2012.01)
*G06Q 10/06* (2012.01)
*G06F 17/50* (2006.01)
*G06Q 10/10* (2012.01)
*G06Q 50/08* (2012.01)

(52) U.S. Cl.
CPC ....... *G06Q 10/0631* (2013.01); *G06F 17/5004* (2013.01); *G06Q 10/06* (2013.01); *G06Q 10/10* (2013.01); *G06Q 50/08* (2013.01); *G06T 2210/04* (2013.01)

(58) Field of Classification Search
CPC .......... G06F 17/5004; G06T 2210/04; G06Q 10/06
USPC ....................................... 705/7.12
See application file for complete search history.

(56) References Cited

U.S. PATENT DOCUMENTS

| | | | |
|---|---|---|---|
| 4,642,780 A * | 2/1987 | Thomson | 703/1 |
| 2001/0056507 A1* | 12/2001 | Bartkowiak et al. | 709/318 |
| 2004/0024624 A1* | 2/2004 | Ciscon et al. | 705/7 |
| 2008/0183483 A1* | 7/2008 | Hart | G06F 17/5004 705/1.1 |

FOREIGN PATENT DOCUMENTS

EP 1477917 11/2004

OTHER PUBLICATIONS

International Search Report and Written Opinion for PCT application No. PCT/CN2010/001842.

* cited by examiner

*Primary Examiner* — Johnna Loftis
(74) *Attorney, Agent, or Firm* — Warner Norcross & Judd LLP

(57) ABSTRACT

An architectural planning system, that includes software and the process thereof, which actively tracks the relationship of organizational groups as well as the required connections therebetween, which information can be actively taken into account during an architectural planning phase. Generally, this provides an improved software tool and process for planning the physical locations of organizational groups within the building space. Further, changes in organizational needs can be readily modified and adapted through direct and dynamic collaboration between these parties.

23 Claims, 34 Drawing Sheets

REPLACEMENT SHEET

ARCHITECTURAL PLANNING SYSTEM AND PROCESS THEREFOR

FIELD OF THE INVENTION

The invention relates to an architectural and space planning system, including the software and processes used therein, which is provided to identify departments or operational groups of an organization and assign physical locations to these departments and groups within multiple available floor plans across one or more buildings.

BACKGROUND OF THE INVENTION

Many organizations, particularly larger organizations such as businesses and the like, group their personnel into multiple groups or departments (sometimes also called functions, business units [BU] or strategic business units [SBU] and the like), which generally focus on particular tasks being performed by the organization. For example, an organization which is in the business of producing and selling various types of products may have separate departments for finance, marketing, R&D (research and development), IT (information technology), PR (public relations), etc. The specific types of departments or groups and the duties associated therewith vary substantially between different types of organizations. Further, the particular size of each department or group or, in other words, the number of personnel assigned to such group can vary depending upon the specific work requirements therefor. In planning a building space to house the organization and its personnel, the building spaces are outfitted with various arrangements of work spaces, furniture, office equipment and the like, wherein the specific space requirements for each of the groups or departments may vary depending upon the physical requirements for such personnel.

When planning the building layout so as to accommodate the personnel of a particular organization, building planners, such as architects and designers (A&D), often are retained by an organization to plan the building layouts and best organize the physical locations of the various departments and groups. As used herein, the term "group" can refer to a formal "department" having an organizational hierarchy, or may refer to a more informal sub-grouping of personnel having a particular assignment of tasks. These groups or departments are sometimes called functions, business units (BU) or strategic business units (SBU), etc. depending on a particular organization. Hence, when planning the physical layout of the organization within a particular building or buildings or space, the building planners, most typically an A&D firm, develops a location plan for placement of the groups within the available physical spaces located in the building floor plan or plans. Due to various building limitations, such as limitations on the floor area, it may be necessary to fit multiple departments or groups within a single physical space, or if the physical space cannot adequately handle all of these groups or even a single large group of personnel, it may be necessary to split or subdivide a particular organizational group into subgroups which are physically separated from each other such as in different buildings in a building complex, or more preferably, on adjoining floors of a single building.

While the organization may be subdivided into multiple departments and groups, these groups may interact frequently with other related groups performing business tasks which are closely related or associated with the tasks being performed by a particular group. Thus, during normal business work days, a particular group or department may have frequent interaction and communications with one or more other groups of the organization, and may have only minimal or little contact with still other organizational groups. Where a particular group has frequent interaction with another group or department, especially when face to face interaction is desired, it may be desirable when planning the layout of a building space to place these related groups closer together in physical location if not in close proximity or directly adjacent to each other so as to more efficiently permit meetings and communications between the groups.

For building planners, such planners typically attempt to identify the various departments and groups and the number of people therein as well as their space requirements. These space requirements usually are defined in the unit of space per person, such as square foot per person or square meter per person [usually called density]. As such, multiplying density by headcount [number of people in each department] results in total needed area for a particular department. Such planners also attempt to determine the amount or level of interaction between related groups. Thereafter, the building planner attempts to take this information into account when assigning physical locations for the different groups within a building floor plan or multi-story/multi-building floor plans.

In the traditional planning process, the building planner, such as an A&D firm, works directly with a client organization to develop an understanding of the departments and groups and their requirements, and then assigns physical locations for such groups within the available floor plan or plans. The traditional process requires numerous meetings between the building planner and the client organization to determine the needs of the client organization and then prepare multiple iterations of floor plans to develop a final floor plan that is most acceptable to the client organization. This typically is an iterative process possibly requiring dozens of meetings, proposals and presentations between the personnel of the building planner and the client organization. For example, the building planner first can conduct interviews with a client organization to identify the departments/groups and determine the needs thereof, wherein these needs possibly can evolve or change over the course of the planning process. The building planner also has the building plans of one or more buildings which are being developed or outfitted for use by the client organization. These building plans typically may be designed in a CAD system wherein the building planner can take the building plans and prepare an initial proposal for the building layout and the location assignments for the departments/groups. These reports may be generated in other available software such as Powerpoint or Illustrator, wherein a presentation is then made to the client organization. In preparing the floor plans and building layouts, the building planner may present the departments and groups as space-covering blocks which cover a portion or all of a particular floor plan, and may provide a multi-layer stacking of the floor plans if the building has multiple spaces which define the layers or stacks of the building. Plans are then generated that generally show which departments are located on a particular floor or in a particular space. Once this information is presented to the client organization, client feedback is obtained and further revisions may then be required to the proposed floor plan through multiple iterations to finally develop a final floor plan that is acceptable to both the client organization and the building planner. In attempting to block and locate the particular departments and groups in a floor plan, the building planner attempts to physically locate the inter-related departments and groups close together either on the same floor or physically adjacent or in close proximity to each other so as to provide the most efficient workflow and interaction between the departments and groups. However, this process typically involves multiple iterations of presentations and comments, which is time-consuming and requires multiple meetings. In such traditional planning process, human errors are not uncommon, either: since different tools are used for developing a proposal, presenting to a client, and then discussing changes with the client. During the process, departments or groups can be left out, can be redundant, or can lose their critical connections with other departments or groups, all unnoticed. This, in turn can create potential problems when designing the building: not enough space to fit all departments with desired density; more space is designed than desired; departments that should be in close proximity get placed far from each other on different floors or even different buildings.

It is an object of the invention to provide an improved planning process which reduces the iterations and time required to develop a suitable building plan, as well as to reduce or eliminate the human error of leaving out departments, mismatching departmental criteria (such as headcount, density or area), and creating redundancies.

The invention relates to an architectural planning system, software and the processes therefor, which uses a video screen to display organizational data representing the different groups, a blocking diagram representing the building floor plans, and a stacking diagram representing the individual floors of a building, as well as an overview of organizational information on each department or group which can be referenced as work group characteristics—or also can be called dashboard, such as size, critical connections, adjacency ratio or resources needed. The architectural planning system allows for dynamic transfer and placement of the organizational data onto the floor plans and into the stacking diagram to quickly allow for dynamic and collaborative development of blocking and stocking diagrams, preferably in a single display. This architectural planning software can be loaded on a portable computer-based system or accessed from a web or server-based location through on-site computers, such as at the client organization's site. This system allows for a direct meeting of members of the client organization and the building planner to review the organizational data, blocking diagrams and stacking diagrams, and further allows for quick and dynamic modifications to the blocking and stacking diagrams, for example in response to face-to-face feedback from the client organization. This allows for a dynamic and interactive meeting between representatives of the building planner and the client organization to not only review a proposed plan, but also make immediate modifications thereto, present ideas, make instant changes, simulate ideas and finalize the needs of the client organization. As such, the client is actively involved in the planning process which allows for co-creation of a proposed building plan on site based on current up-to-date information received from the client organization. The software and process of the invention actively tracks the relationship of the organizational groups as well as the required operational connections needed therebetween and even tracks the desired connections which are not required but still are preferred. This connection information can be actively taken into account during the planning phase. Generally, the invention provides an improved software tool and process for planning the physical locations of organizational groups within the building space, reducing or eliminating human errors and greatly minimizes the service hours required of personnel from the building planner and client organization in developing a final proposal. Further, changes in organizational needs can be readily modified in the plans and handled quickly through direct and dynamic collaboration between these parties.

Other objects and purposes of the invention, and variations thereof, will be apparent upon reading the following specification and inspecting the accompanying drawings.

BRIEF DESCRIPTION OF THE DRAWINGS

FIG. 17 illustrates the display of FIG. 16 with a data change box turned on.

FIG. 23 illustrates the display of FIG. 22 with the stacking diagram turned on.

Figure 2:
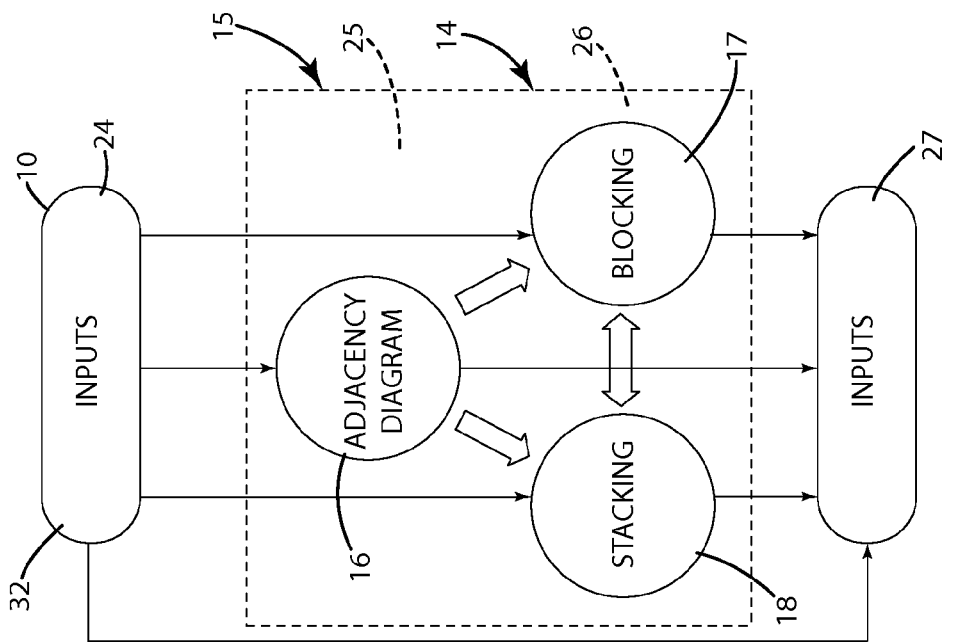
FIG. 2 diagrammatically illustrates the architectural planning system including the software and process of the invention.

Certain terminology will be used in the following description for convenience and reference only, and will not be limiting. For example, the words "upwardly", "downwardly", "rightwardly" and "leftwardly" will refer to directions in the drawings to which reference is made. The words "inwardly" and "outwardly" will refer to directions toward and away from, respectively, the geometric center of the arrangement and designated parts thereof. Said terminology will include the words specifically mentioned, derivatives thereof, and words of similar import.

DETAILED DESCRIPTION

Figure 1:
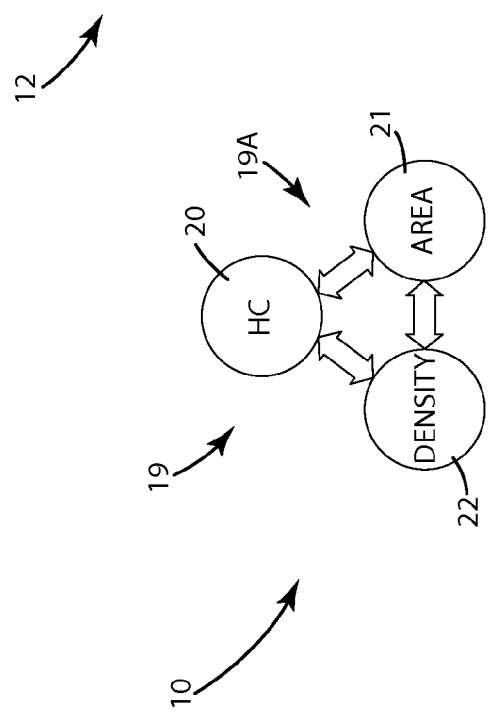
FIG. 1 diagrammatically illustrates the organizational data developed for the architectural planning process.

Referring to FIGS. 1 and 2, the invention relates to an architectural planning process diagrammatically represented by FIGS. 1 and 2 which obtains or generates initial organizational data 10 (FIG. 1) for an organization such as a business or institution. The data 10 is input into and used in combination with an inventive architectural planning system 12 which comprises architectural planning software 14 that is used in association with computer-based hardware 15 in order to develop the floor and space plans in which an organization would be physically located. As described above, each organization with which the architectural planning system would be used may differ significantly from each other both in departments and groups which make up the organization, as well as the numbers of personnel and the space requirements associated with each of these groups. Further, some groups may have close interaction with some other groups such that selected groups may have a greater need of being closely located in proximity to other groups. These related inter-connections may rise to the level of a highly-desirable "need" or may be less significantly classified as a "want". Such connections may be more precisely described with "strong connection," "weak connection," "no connection" (where it simply does not matter whether two departments are adjacent or not), and "seclusion" (where two or more departments must be secluded from each other, such as areas with high-security need). Hence, a plurality of different designations may be used to define or designate the connections between various groups. The architectural planning system 12 of the invention develops and identifies this information as part of the initial organizational data 10 and then uses such data 10 within the architectural planning system 12 to develop the architectural or space plans most suitable for each particular organization and the specific and unique requirements of such organization.

The architectural planning system 12 in a first aspect is a planning tool that allows for the development of data associated with each group including the head count (HC) or number of personnel, the area preferably required, and the density of personnel within this area which then allows for the generation of a bubble diagram or adjacency diagram 16 which diagrammatically represents and illustrates the different organizational groups as well as their related connections during real world operations. As FIG. 1 shows, headcount, density and area are interconnected, meaning that by defining two of them (usually the headcount and density in practice), the third is automatically calculated by the system and preferably the software thereof. This is a substantial advantage of the invention, since this completely eliminates human error during the planning process. This planning tool also incorporates a blocking diagram 17 and a stacking diagram 18 which are generated by the user using the data embodied within the bubble diagram 16, as will be described in further detail hereinafter. In addition to serving as an architectural planning tool, the planning system 12 further is a vehicle for visual communication between a building planner such as an A&D (Architecture and Design) firm, and a client organization. As described above, the planning system 12 allows for real-time changes during meetings and communications between the building planner and client organization, and allows for immediate simulation of planning changes which can be performed in front of the client to obtain immediate responses thereto which reduces the overall planning time and the number of meetings required to effect development of a final building plan. Besides, the aforementioned interconnections among important sets of data (FIG. 1) eliminates human error during the process.

In more detail, FIG. 1 represents the organizational data 10 which is either 1) manually inputted to the system (via a user interface, where user inputs department names and for each department head count (HC), density, and area information [input two of these three in any combination and the system calculates the third]; user also has the option to input other organizational information for each department [such as a contact person's name, phone number, critical connections, resources needed, and any other information in free form]); 2) imported to the system from a spreadsheet or other collection of data or data source (information imported is similar, but not limited to what user can manually input as described under item 1 above)); or 3) surveyed, typically as the first step of the space-planning process. If organizational data is either manually inputted or imported to the system, the building planner or a third party performs a data collection step beforehand with the client organization to not only identify the various organizational groups which form the organization, but to also develop a data set 19A for each group 19 which comprises the head count 20 (FIG. 1), the area 21 preferably desired for accommodating this head count or number of personnel 20, as well as the density 22 of this group which is the head count 20 divided into the overall space or area 21 allotted to this group 19 to determine the amount of work space or area allotted to each person. In addition, the planner also collects information on departmental adjacencies, that is, which departments must be in close proximity to others, usually in the form of either a "wanted" and "needed" connection, or a more comprehensive "strong connection," "weak connection," "no connection," and "seclusion." When such organizational data is "surveyed directly into the system," the user (planner) sends out a weblink to the client organization's contact person, asking for distribution to all employees affected. Employees then take a short web-survey, following the weblink. Data generated from the surveys (such as department names, critical connections) is then directly fed into the system, together with some critical manual input from the planner (such as headcount, density and area). It is the option of the user (planner) to decide which input method to use in order to provide organizational data for the system. While most A&D firms have already developed a system of collecting such information from their clients (usually in the form of interviews, focus groups, questionnaires, or the combination thereof), some might prefer to use the invention's sophisticated data collector option. This data set 19A for the group 19 is stored in association with the group name or an abbreviation therefor, and is a representative and preferred data set, although the planner may also find that additional data is useful which may then result in additional modifications to the planning system 12. For example, the particular organizational groups 19 may also have particular and unique requirements such as a particular type or style of office furniture, i.e. a more private office-furniture environment defined by freestanding walls or a more open desking or benching system. As such, it might be desirable to also locate particular groups having similar physical needs such as office furniture needs in close proximity or on the same floor so as to provide for a consistency in the type of equipment outfitted in a particular space. However, at this stage of the planning process, this factor may be less significant as compared to the organizational requirements of how the individual groups function and interact with each other group as part of the real-world operations of the organization.

Most generally as described above, the organization likely can provide the necessary information to identify the groups and the head count for each, which information could then also assist in identifying the preferred density and area for such group. For example, an initial estimate of the total area 21 required for each individual may simply be used with the total number of the head count 20 to generate an initial density 22 which is preferred for this group 19. The data collection step may also include providing the personnel of the organization with individualized surveys as described above which help identify the primary groups and possibly identify sub-groups of personnel within a particular group. This information also can assist in identifying which groups preferably "need" to be close to other groups, or in other words, possess a needed connection with other groups in order to best perform normal daily activities. This data collection step also works to identify related connections with other groups which may not be needed but are preferred or "wanted" to also improve the efficiency of daily activities. As described above, other designators may alternatively be used. This organizational data 10 preferably is provided as part of the inputs 24 that are input into the computer-based system components 15 as seen in FIG. 2, preferably in an automated manner, where individual survey data is directly fed into the system and the adjacency diagram is generated automatically thereafter. Generally, the system components 15 comprise a computer-based processor 25 which is able to store the organizational data 10 as well as other inputs 24 such as individual floor plans which are discussed in greater detail hereinafter. This processor 25 operates a visual display 26 and also is able to generate various outputs 27 such as a visual display and print-outs or saves data of the bubble diagram 16, blocking diagram 17 and stacking diagram 18 which can then be used in developing a final space plan, or used as an intermediate proposal which is forwarded as a report to the client organization. The processor 25 controls the visual display 26 such as a computer monitor or the like which visually displays the bubble diagram 16, blocking diagram 17 and stacking diagram 18 for use by the building planner and organization.

Figure 3:
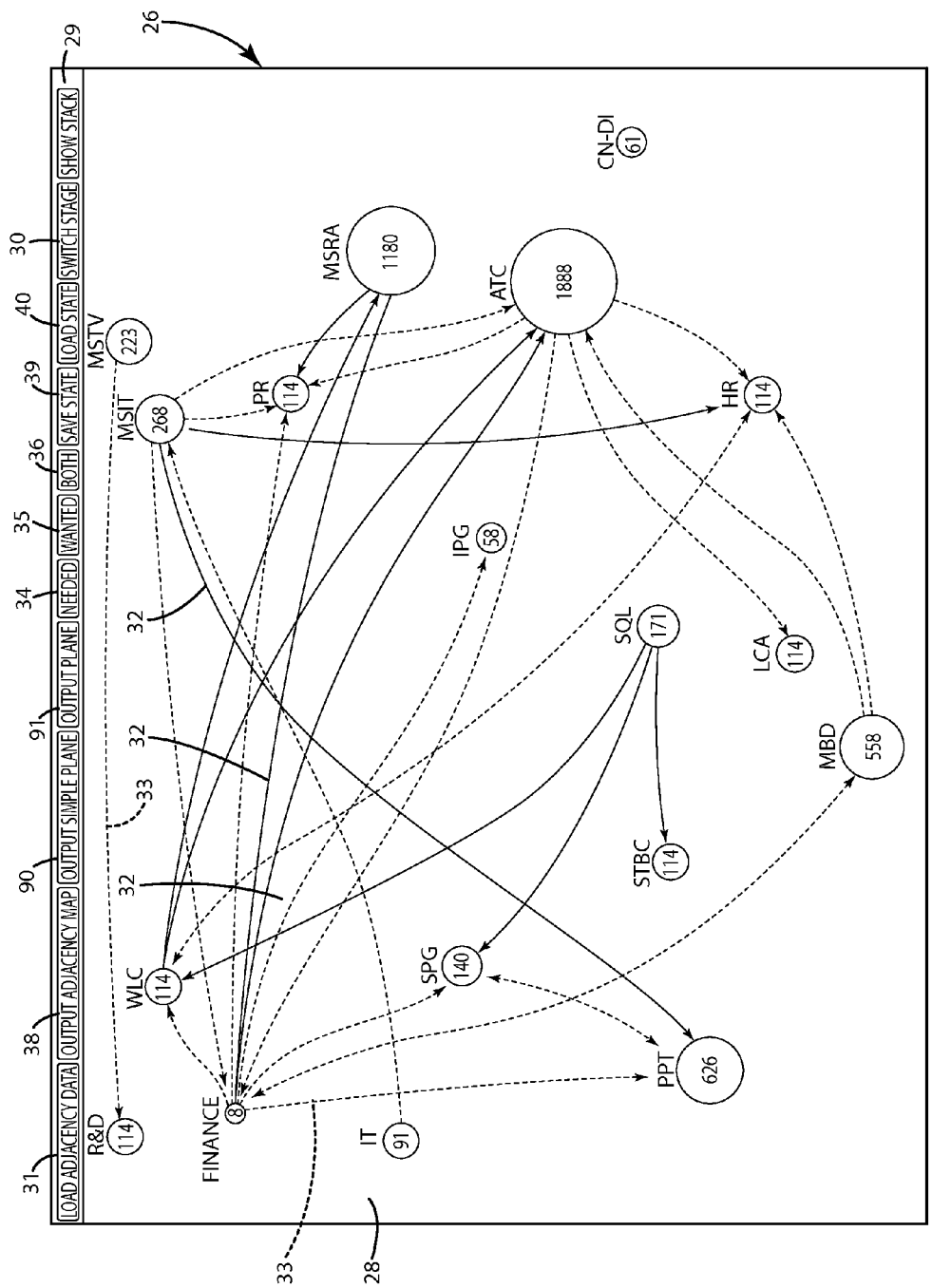
FIG. 3 diagrammatically illustrates a first system stage having a visual display with a bubble diagram or an adjacency diagram screen showing both needed and wanted connections between organizational groups.
Figure 4:
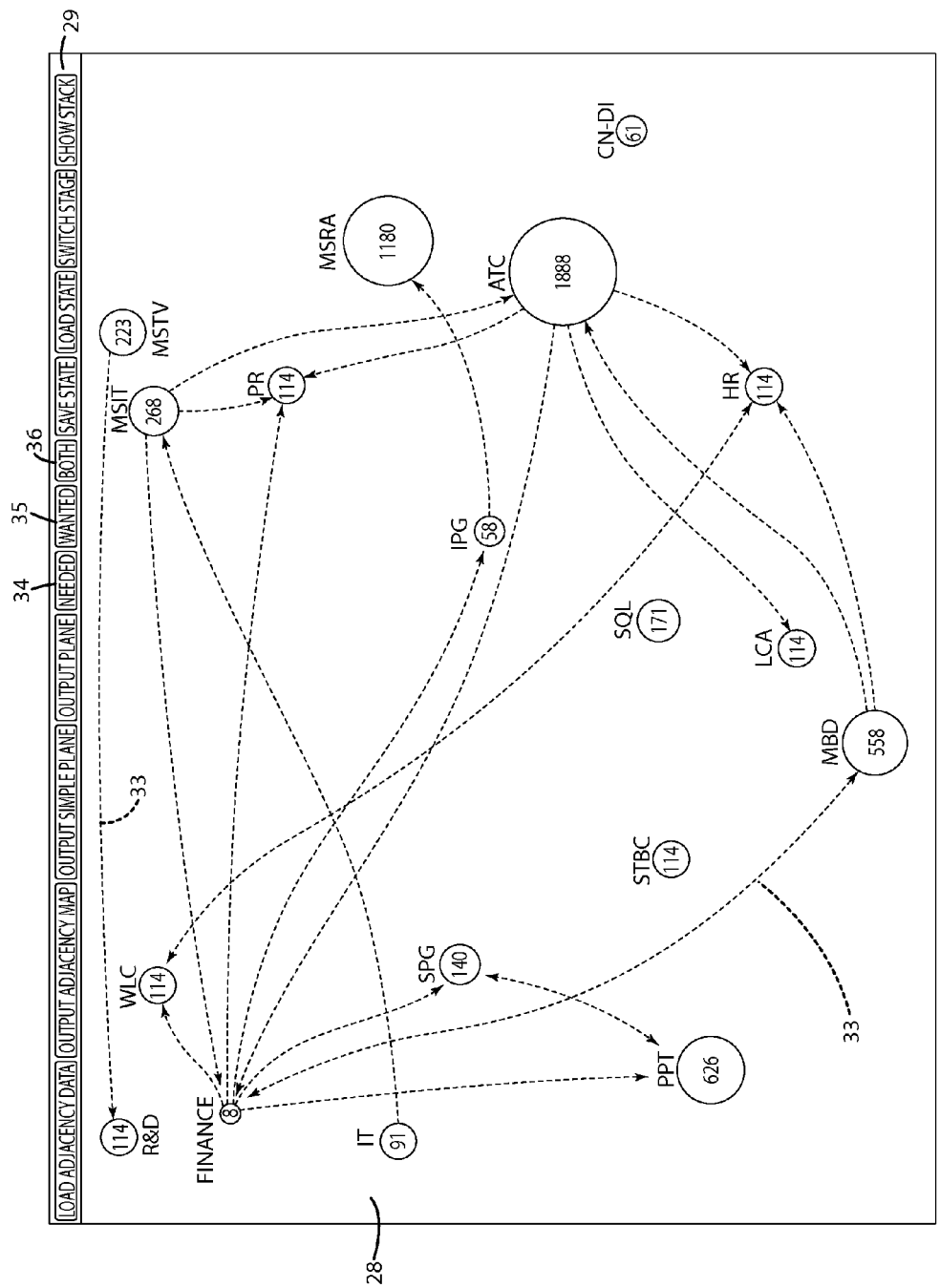
FIG. 4 shows the bubble diagram with the wanted connections turned on and the needed connections turned off.
Figure 5:
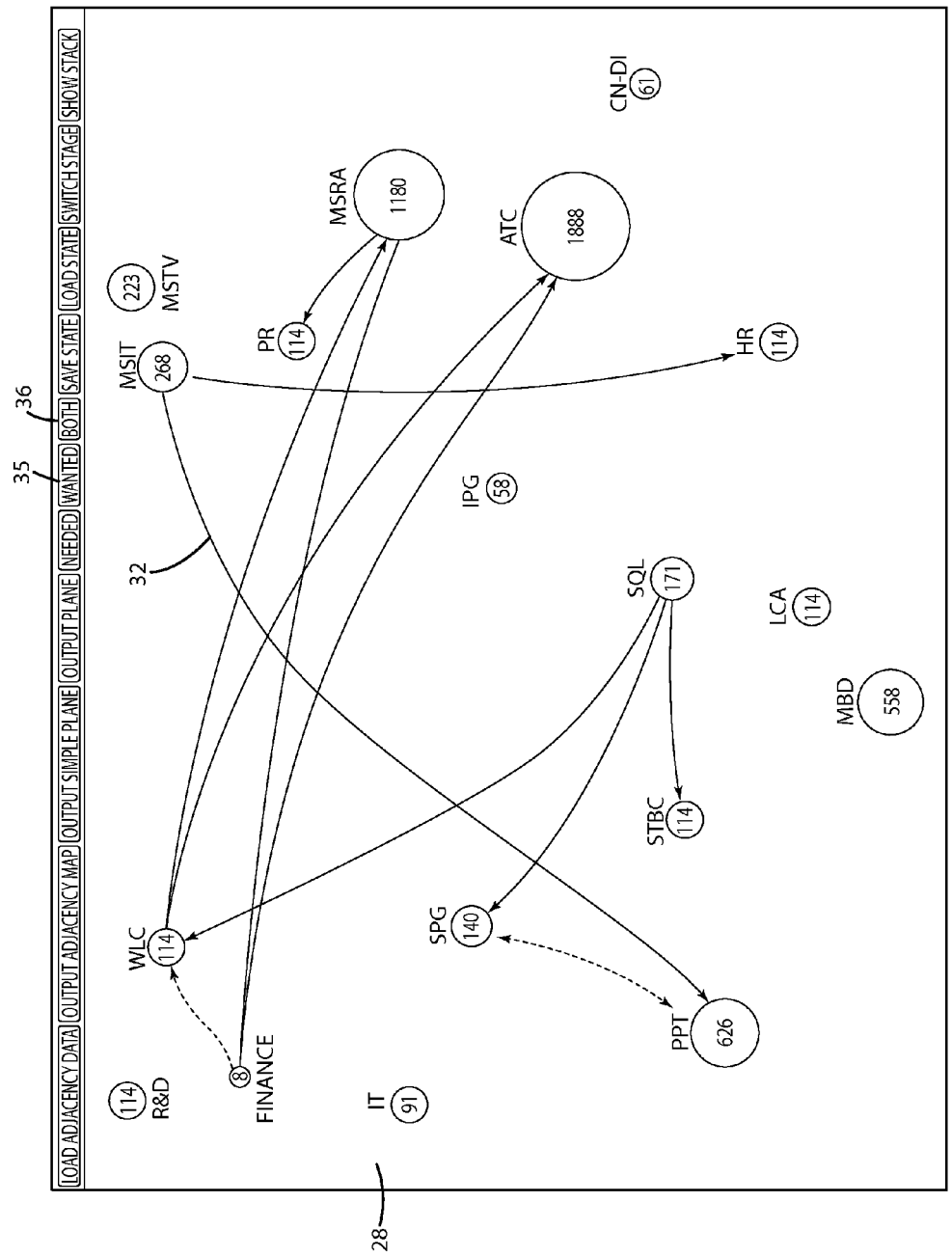
FIG. 5 shows the bubble diagram with the needed connections turned on and the wanted connections turned off.

With respect to the system processor 25, this may be any suitable hardware running any operational systems (OS) such as Mac OS, Windows OS, Linux or any other OS platform thereby allowing the inventive system to be platform independent. Any suitable hardware may be used such as a local computer such as a laptop or desktop, a facility server which is located remotely and accessed through the visual display 26 and any other input devices at a remote terminal location. While the input devices may be a mouse and keyboard, a touch screen, digitizer pen/puck, or other input formats may be used. With a touch screen, this would function as both the display and input device. Alternatively, the processor 25 may be a web-based server which is located offsite and accessed through a computer and its display 26, so that the invention is operating completely web-based. The inventive process preferably is embodied and formed by any computer-based software code (such as .Net, Flash/Flex, Objective C, C# or any other) which in the preferred embodiment is a Java-based program which is run on a local processor or may be accessed through a web-based portal accessing a remote server. When the software of the invention is run and displayed on a screen 28 (FIG. 3) of the visual display 26, the planning system 12 preferably can toggle between a bubble diagram stage as seen in FIGS. 3-5, or a multi-pane stage shown in FIGS. 6-9. In this regard, the planning system 12 preferably displays a control bar 29 along the upper edge of the screen 28 which has various buttons that can toggle between different options of the planning program. The control bar 29 includes a "switch stage" button 30 which can be clicked by the input device such as the mouse, to toggle between the bubble diagram stage (FIGS. 3-5) or the multi-pane stage (FIGS. 6-9). The control bar 29 includes a load adjacency button 31 which initially allows for loading of the inputs 24 including both the organizational data 10 and the facility data 32 (FIG. 2) which preferably comprises detailed floor plans for each building space or floor level in which the organization is being housed. Loading floor plans is preferably done in a two step process: 1) exporting a unique file format (such as .haworth) from the CAD (Computer Aided Design) or BIM (Building Information Modeling) software that the planner uses (with the help of a previously installed plugin to the planner's preferred software); and then 2) importing the unique file into the system. More particularly, due to proprietary file formats, it may be difficult to directly import files from other software, such that the planning system would use a so-called plugin software for the user's CAD or BIM software that the user will need to install. Then, using this plugin, the user will export the floor plans from their CAD software, such as AutoCad, into a special file format which may be called .haworth or .haw or other selected file extension. The planning software then would import those files with the special file format (.haworth or the like), using the identified layers as contours for collision detection.

However, loading floor plans might be possible with directly importing files from the planner's preferred CAD, BIM, or similar software used for the building design process. More than one floor plan can be simultaneously imported into the system (such as multiple floors or multiple buildings or both), and the user might also have the option to later delete, modify, or re-import part of or the totality of the floor plans. In the bubble diagram stage of FIG. 3, the individual groups 19 described above of FIG. 1 are identified by alpha-numeric identifiers in FIG. 3, which identifiers are associated with the specific title or type of group. For example, some of the groups 19 are labeled as "FINANCE", "R&D", i.e. research and development, "IT", i.e. information technology, "PR" i.e. public relations, and "HR" i.e. human resources and other appropriate identifiers. The specific type of identifier is not critical to the current invention other than the identifier is preferably chosen as a shorthand or abbreviated designator for the particular group. Each group has the head count for such group identified numerically within the middle of the bubble wherein the size of the bubble preferably is sized in correlation or proportion to the total head count or departmental area (where user might be able to select which method to use) relative to other bubbles. For example, group MSRA has a head count of 1180 and therefore is substantially larger than the FINANCE group which has a head count of 8 and is substantially smaller when represented in the bubble diagram of FIG. 3. Bubbles are "intelligently" displayed on the screen for the ease of overview, no matter the complexity (or the lack thereof) of the project. This is done in a fashion that they are neither crowded nor sparse, by determining the relative size of the largest and smallest bubbles in relation to the number and size of bubbles in between them to fill similar percentages of the screen. Bubbles below a certain size threshold are plotted with the same sizes to preserve visual legibility. Bubbles are also automatically displayed at first to keep approximate equidistance in between them, as well as displaying connections with shortest possible connectors to reduce clutter. The system uses a so-called forced directed layout (or spring layout), so when a project is loaded, bubbles with most connections tend to gravitate to the middle. Initially, the bubbles commonly have an initial color such as white on a contrasting screen background. The system may allow the user to change these colors to accommodate colors of preference for a particular project. The user may also be able to change the bubbles' configuration (department name or code, headcount, area, or density), change or add connections between bubbles, add new bubbles with new parameters and connections, or completely delete (remove) bubbles. The user can select the appropriate measurements according to project need (global support): such as metric system or the imperial system, etc.

Also, the various bubbles for each group are shown with either solid line connections which show the related connections 32 between particular groups and other groups that are "needed", as well as dash line connections 33 which indicate "wanted" connections between groups which do not rise to the level of "needed". For example, the FINANCE group has needed connections 32 which extend from the FINANCE bubble to the bubbles for MSRA and ATC. The FINANCE group also has additional wanted connections with other groups as indicated by reference lines 33. FIG. 3 shows both the wanted and needed connections turned on the display screen 28. The control bar 29 also includes buttons for Needed 34, Wanted 35 and Both 36, which buttons can be selectively clicked or toggled by an input device to turn on or off the related connections 32 and 33. For example, in FIG. 4, the needed button 34 is toggled to turn off the needed connection lines 32 while leaving on the wanted connection lines 33. The wanted button 35 of FIG. 3 also could be toggled which would turn off the wanted connection lines 33 and leave the needed connection lines 32 turned on as seen in FIG. 5. If the Both button 36 were toggled from either of the display states of FIGS. 4 and 5, this would return the display screen 28 to the display state of FIG. 3. In this manner, it can be readily determined which groups are connected to each other or not during real world operations. Such connections can also be displayed, using connectors between bubbles with different line types (such as solid, dashed, dotted, etc.), different line thicknesses, or with different colors, where different lines always depict different type of connections (such as "strong connection" or "weak connection," or different gradients in between these two extremes. The connection type "no connection" (meaning that two departments can either be adjacent or not, it does not matter) is usually depicted with no connector drawn between two bubbles. Other types of connections might include "seclusion," where two or more departments must be secluded (not adjacent, or if adjacent, physically—such as a secured wall—secluded) from each other, and could be depicted with a special (dashed, red, etc.) curved line around or encircling the bubble.

It will be noted that the various display states of FIGS. 3-5 have the connection lines 32 and 33 intersecting which may become complicated to visualize when multiple lines are displayed, particularly as seen in FIG. 3. Therefore, the system preferably uses color-coded highlighting of the connection lines to better visualize these lines. More specifically, the individual bubbles for the groups preferably are shown in the light initial color, such as white, on the darker background of the screen 28 which is shown as a gray background in FIGS. 3-6. If the input device such as the cursor of a mouse on the display screen 28 is placed over any particular one of the group bubbles, this will cause all of the related connection lines 32 and/or 33 to then change from an initial white line color for solid line 32 or a red line color for dashed line 33 to a bright yellow color which will also cause each of the related bubbles to then change from white to the highlighted color of yellow. The group bubble over which the cursor resides will remain in the initial starting color, but any of the related bubbles connected by lines 32 or 33 as well as the lines themselves will then change from their initial color to the highlight color, which preferably is a bright yellow. As mentioned earlier, user might preferably change the color of any or all bubbles and lines to accommodate preferences for a particular project.

To also provide for easier display of the connection lines 32 and 33, the cursor of the input device may be directly placed over any desired bubble and one of the control buttons such as the left mouse button can be held down to then drag any of the bubbles to a new position which also causes the connection lines 32 and 33 to be pulled therewith. Hence, the bubbles can be individually moved from a first position to a second position eliminating confusing overlap of the lines to better visualize the connection lines 32 and 33.

These connection lines are particularly valuable in preparing the blocking diagram 17 and stacking diagram 18 since the user of this system is prompted by the connection lines 32 and 33 to attempt to locate any related or connected bubbles in close proximity to each other when physically locating the organizational groups within a facility space. For some bubbles, such as group CN-DI along the right side of screen 28 in FIG. 3, the head count of 61 is shown, but there are no connection lines which thereby indicate this is an independent group which has the most flexibility in placement within the facility space since there would be no need or desire to locate this group relative to any specific other group.

The bubble diagram of FIGS. 3-6 also may be referenced as an "adjacency map." This bubble diagram also can be output as a computer file, preferably in a picture-type format which may then be used for any other need such as presentations or the like. To output the bubble diagram, a toggle button 38 (Output Adjacency Map) is provided on the control bar 29 which may be clicked or toggled by the input device to start a save sub-routine that allows for file saving of the output to a desired location on a storage device such as the hard drive of the computer 15.

Also, a Save State button 39 is provided which would then initiate a further save sub-routine which would store a different data file on the computer storage device to save the particular display state of the various screens and the data therein. Therefore, after movement of the group bubbles to a desired display state such as the display state of FIG. 3, the Save State button 39 may be toggled or clicked to initiate the save routine and save this particular visual display which can then be recalled at a later time through the Load State button 40 which restores the data to the particular save state that had previously been stored. This is particularly useful when developing the blocking diagram 17 and stacking diagram 18 since the particular data and placement of the groups in different facility spaces can be stored and then restored later for subsequent use. Alternative display states can then be developed by moving the group bubbles in the group diagram of FIGS. 3-5 or by modifying the blocking and stacking diagrams 17 and 18 which can then be saved in an alternative data file through the Save State button 39. Hence, alternative building plans can be stored and evaluated with the organizational client and then worked with individually with the client to modify according to the client's wishes. These modifications can then be again saved through use of the Save State button 39 in either a modified data file or in a new data file so that multiple alternate proposals can be worked on for the same building project.

The "Save state" function not only preserves the blocking and stacking diagrams and changes to bubbles (such as altered, or new connections/bubbles), but it also saves the exact position of the bubbles, as the user rearranged them for a more suitable layout than the original auto-generated layout. Then, the user preferably will have the option of retaining an auto-generated layout by clicking on a regenerate or similar button to clear up clutter, if needed.

Figure 6:
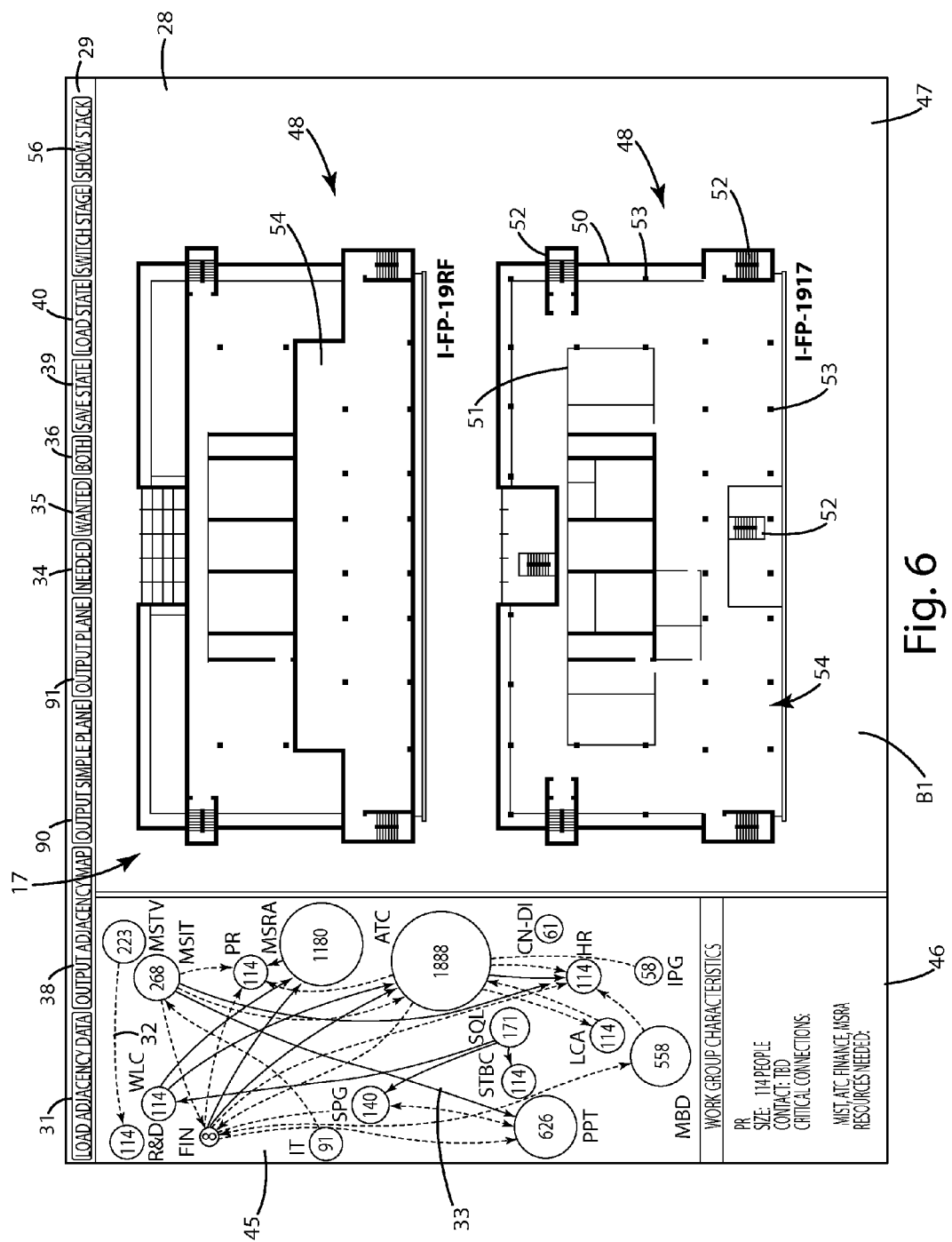
FIG. 6 illustrates the visual display of a second stage with data panes including a bubble diagram pane, a work group characteristics pane (also called the dashboard), and a main planning pane which includes a blocking diagram comprising a plurality of floor plans displayed thereon.

Next, the Switch State button 30 can be clicked or toggled by the input device to thereby leave the bubble diagram of FIGS. 3-5 and switch to the multi-pane planning stage of FIGS. 6-9. Referring to FIG. 6, the multi-pane planning stage of FIG. 6 still includes the above-described control bar 29 which continues to be visually displayed on screen 28 and contains the same buttons as referenced above in FIGS. 3-5. Additionally, the display screen 28 preferably comprises three panes, namely a bubble diagram pane 45, a work group characteristics pane 46 and a main planning pane 47. As to the bubble diagram pane 45, this basically shows the bubble diagram and connections of FIGS. 3-5, although in a much smaller space. Initially, the bubbles when unassigned to a particular floor plan have the light color on the darker background and preferably has a white color on the gray background as described above. Also, the needed and wanted connections, or any other type of connections predefined by the user (such as "strong connection," "weak connection," "no connection," or "seclusion") can be toggled on and off using the above-described buttons 34, 35 and 36. Further, the Save State 39 and Load State buttons 40 can be used to save the particular display states as the planning process progresses and also allows return to a particular visual state through the Load State button 40 if work is continued at a later time or moved from one location to another. Also, the bubbles can be moved or displaced to any particular location in the pane 45 to better view the related connections 32 and 33 which are carried forward from the bubble diagram of FIG. 3.

Any of the bubbles may then be chosen for placement and planning. For example, the PR bubble is clicked on by the input device, which changes the initial color to a second color such as a darker gray as seen in FIG. 6. This activates the bubble and causes information from the initial data set 10 to be displayed in the work group characteristics pane 46 as seen in FIG. 6. Specifically, these characteristics include information as to the size or head count, a contact person, which in this case is to be determined (TBD), a listing of critical connections which corresponds to the needed connections indicated by lines 33, as well as resources needed. In this case, resources are not listed in this section but might include meeting spaces, labs, or other facility resources. During this initial selection stage, other information such as density is omitted from the characteristics pane but will become visible as described below.

The work group characteristics pane 46 could also be called the "Dashboard", and may include other useful features which may include: there could be information on how many bubbles or what headcount/what space (in absolute terms such as people and square meters and relative [%] terms) have been already used such as being dropped to the floor plans from the bubble diagram. The work group characteristics pane 46 or dashboard may also include what proportion or how many of the bubbles still need to be "worked on" (dropped). Another useful function might be that the system will flag adjacency ratios that are too low—those groups need to be placed in closer proximity to their connected groups.

Next, the main planning pane 47 essentially is the functional pane in which the facility space information is displayed and to which the position of the groups can be moved from the bubble diagram pane 45 to the floor plans 48. In this regard, FIG. 6 illustrates the blocking diagram 17 which comprises detailed floor plans 48 of the various floors or spaces associated with the building in which the organization will be housed. The floor plans are stored as part of the facility data 32 that is entered with the inputs 10 in FIG. 2 and represents real world data for the facility or building in which the groups will operate. In the exemplary data used in the figures, the blocking diagram 17 comprises a floor plan or plate 48 for each floor of two multi-story buildings located next to each other. The building could also be a single story building, or multiple buildings forming a complex, and the particular floor plan arrangement will depend upon each particular organization being evaluated and the facility that is being designed.

Figure 7:
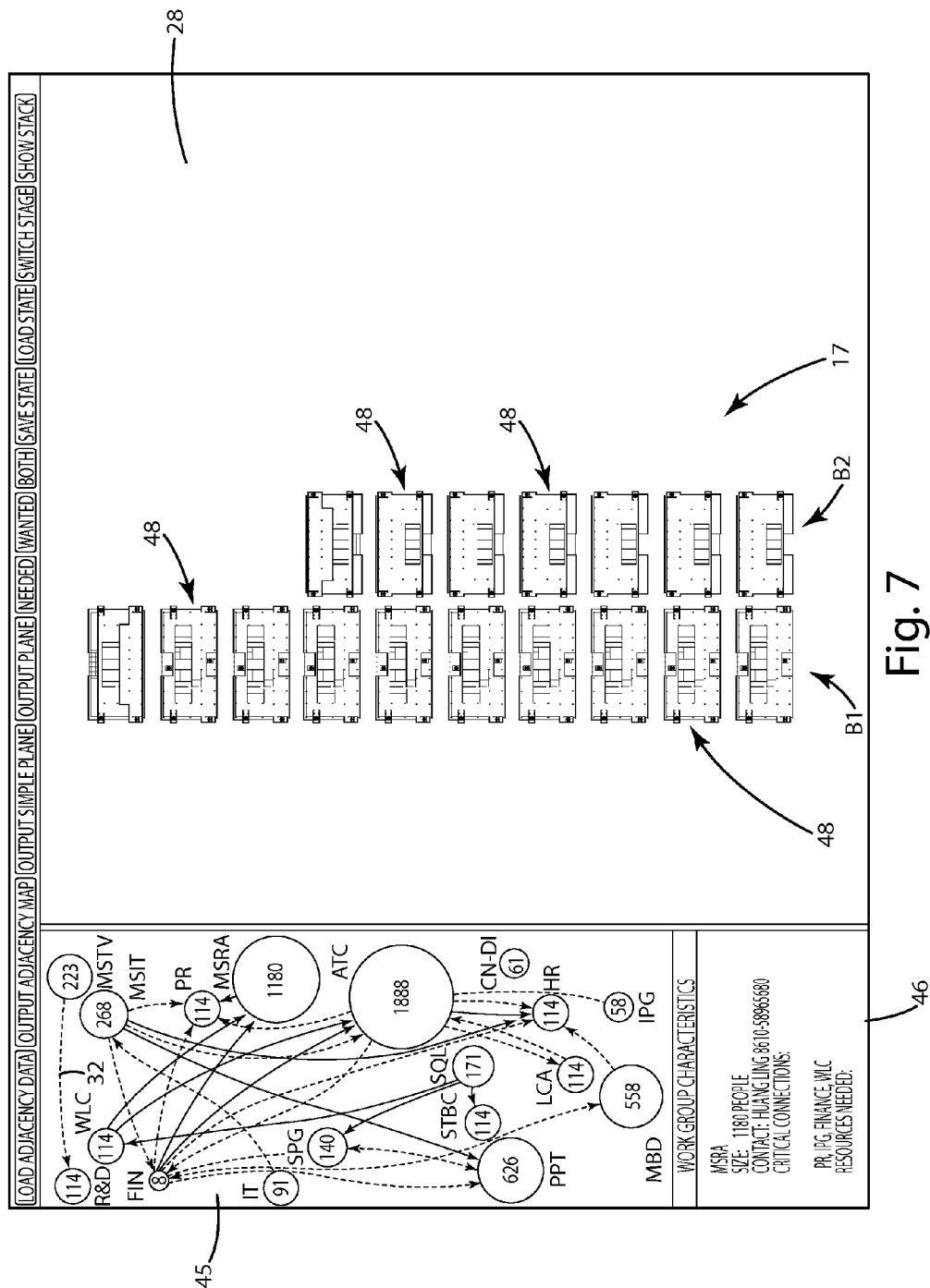
FIG. 7 shows the display of FIG. 6 wherein the planning pane is zoomed out to illustrate a greater number of floor plans.

The floor plans 48 will have been loaded when the Load Adjacency Data button 31 is clicked as referenced above. This will display the floor plans in a desired arrangement in pane 47, which may be organized by the level of the floor relative to ground level, such as the basement level at the bottom position, and the floors progressively increasing in height. The blocking diagram 17 can be zoomed in and out or enlarged and reduced through an input device such as the scroll wheel of a mouse or the +/− keys of a keyboard. FIG. 7 shows the building plan zoomed out and shows the two different buildings B1 and B2 located side by side to each other. Hence, multiple buildings can be shown in the same blocking diagram 17. Further, the labels for each floor indicate the floor level, wherein label 1917 in FIG. 6 can indicate that building B1 is identified in the real world as building 19, floor 17, while label 19RF indicates the roof level floor of the same building B1.

Further, the floor plans 48 can provide substantial architectural details such as exterior and interior walls 50 and 51, stairwells 52, columns 53, and the like. Most significantly, the floor plans 48 include empty (available) spaces 54 in which the organizational groups/departments can later be planned. In the initial state, these empty spaces 54 can be seen in FIG. 6.

Figure 8:
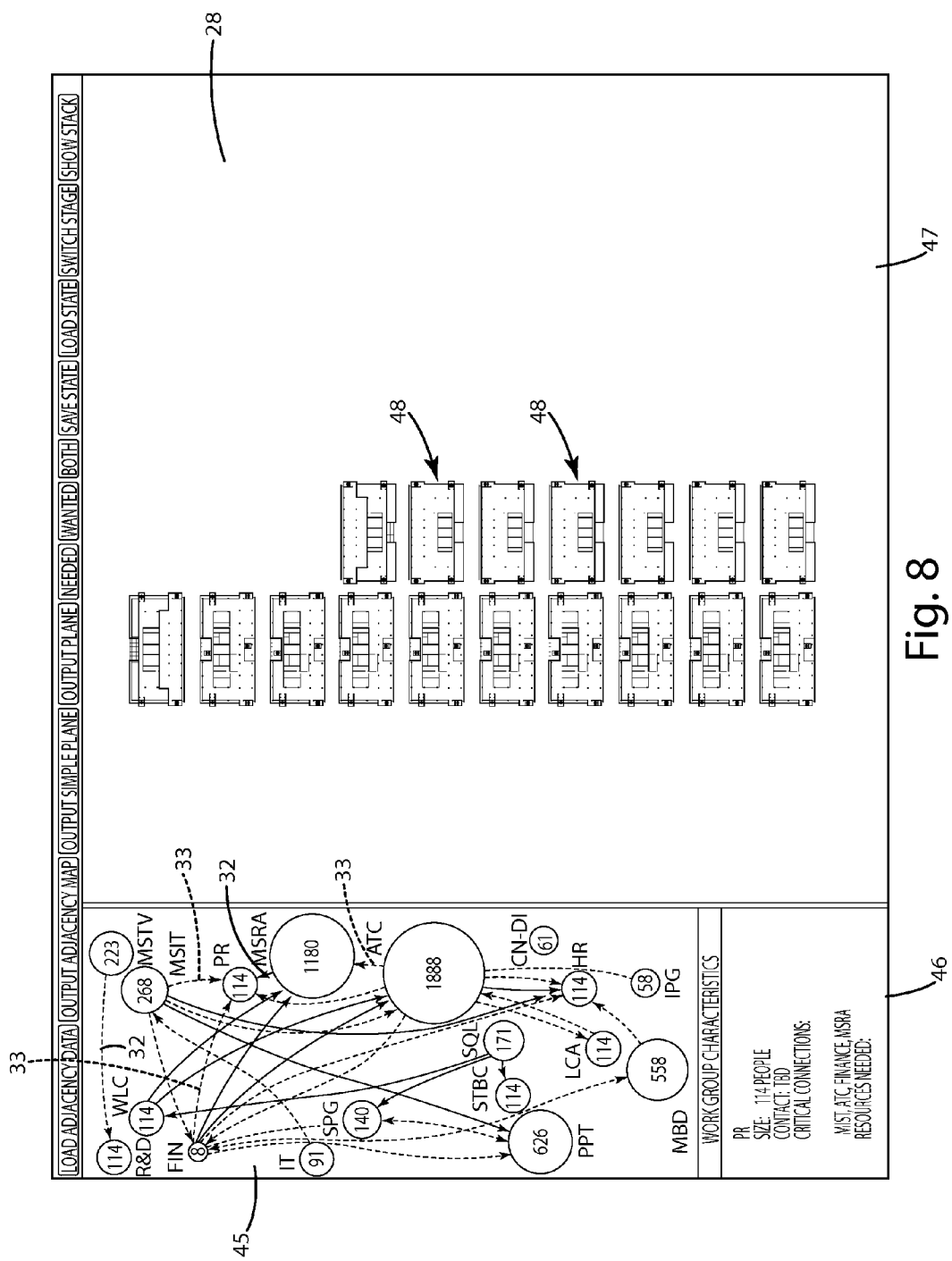
FIG. 8 shows one of the bubbles for a PR group highlighted which further highlights other bubbles which are related thereto by related connections.

At this stage, the building planner will review the available groups or departments in the bubble diagram 45 and make an initial selection of the group to be placed first on any of the available floor plans 48 of buildings B1 and B2. For example, the group PR is selected in FIG. 8 for initial placement. By clicking or activating the PR bubble in the bubble diagram 45, the bubble PR changes from an initial color, namely white, to a second color, such as grey, which indicates this bubble PR is active, and causes any related bubbles to change to a highlighted color, such as bright yellow. In FIG. 8, bubbles MSRA, ATC, MS, IT and FINANCE all highlight as shown with a grey color in the grayscale of FIG. 8, it being understood the preferred highlight color would be yellow or another bright color on a color screen. This provides a visual indication of what other groups or bubbles preferably would need to be moved next to maintain the Needed or Wanted (or any other pre-defined) adjacencies within the floor plans 48.

Figure 9:
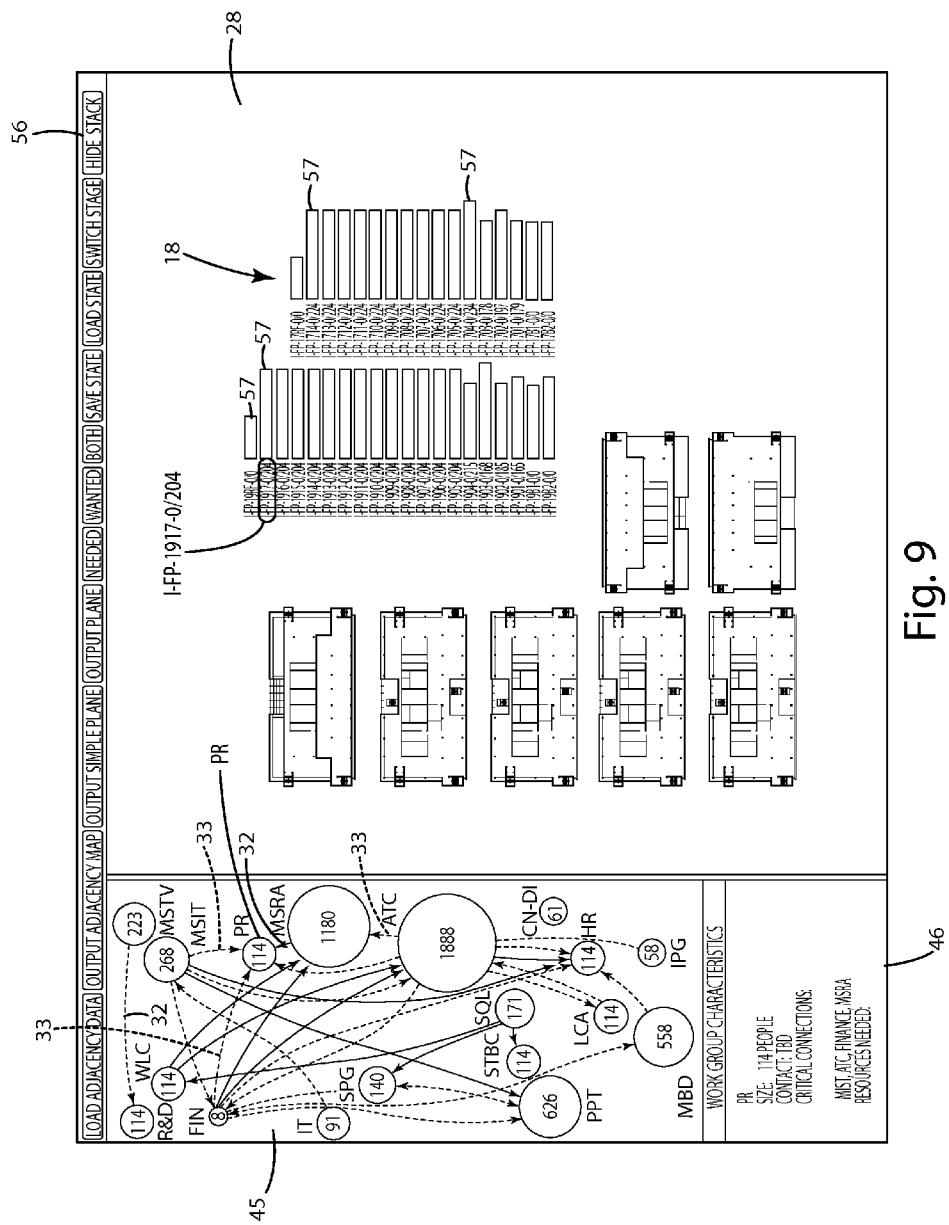
FIG. 9 shows both the blocking diagram and a stacking diagram displayed simultaneously within the planning pane in an initial state. The blocking diagram and stacking diagram can be considered a combined stage of the system or even two stages.

At this selection and placement stage of the process, it may be desirable to turn on the stacking diagram 18 as seen in FIG. 9 by toggling the Show Stack/Hide Stack button 56 seen in FIGS. 6 and 9. The stacking diagram 18 has individual graph-like stack bars 57 which represent each floor or space of the floor plans 48. The size of each bar 57 is proportional to the total available space 54 on each floor, and is initially shown in an initial color such as white to indicate that all space is available or unassigned. Each bar also shows the total assigned headcount/maximum headcount next to the bar 57, which for example, is initially 0/234 for floor 1917 mentioned above. These bars 57 will eventually be filled with color-coded fill that is proportional to the amount of space used by an assigned group or groups. If desired, the stacking diagram 18 may also be turned off by the Hide Stack button 56 of FIG. 9 to return to the hidden state of FIG. 8.

Figure 10:
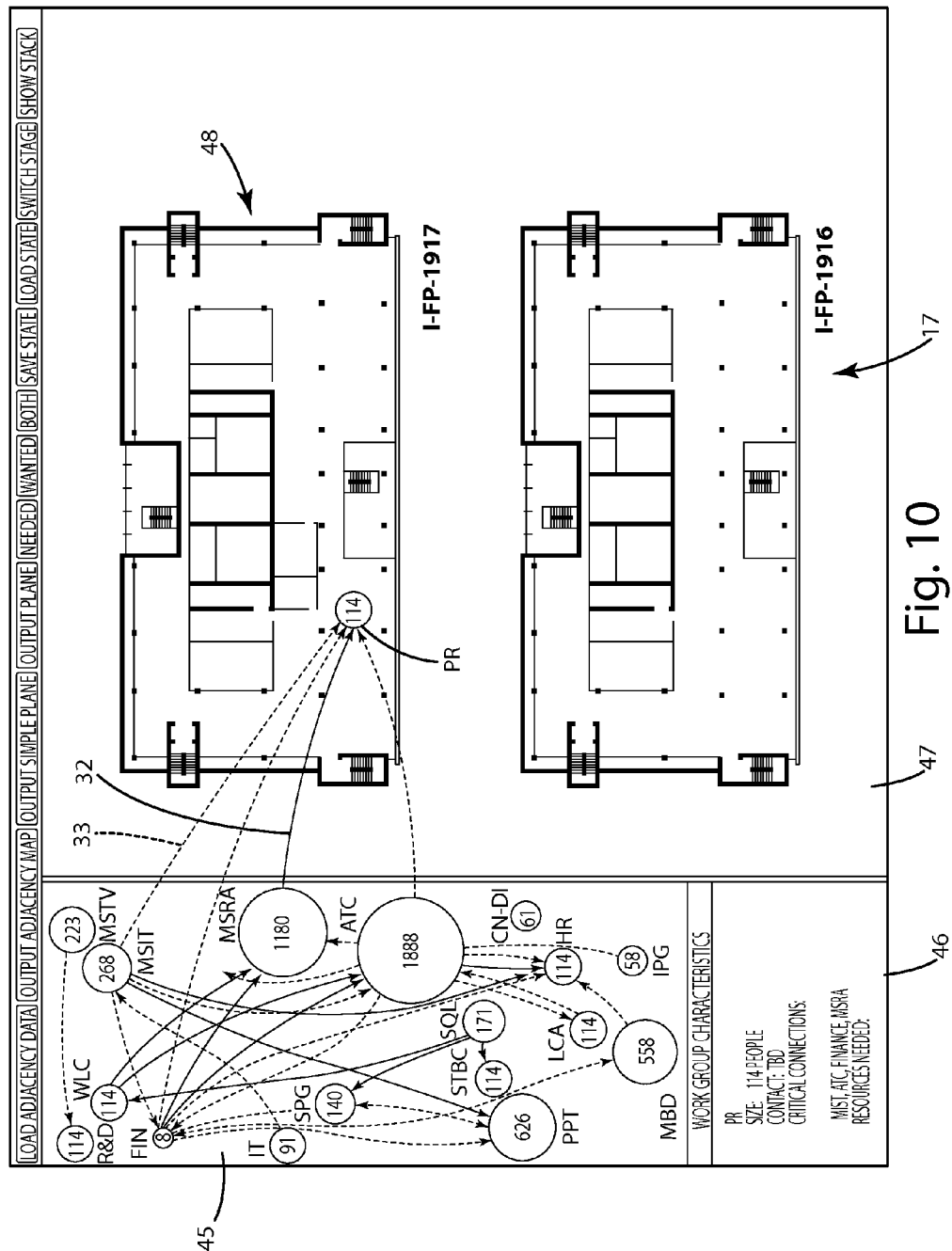
FIG. 10 illustrates one step of the planning process wherein an input device such as a mouse is used to drag a first group bubble into the main planning pane with the needed and wanted connection lines pulled or dragged by the input device into overlapping relation with the planning pane.
Figure 11:
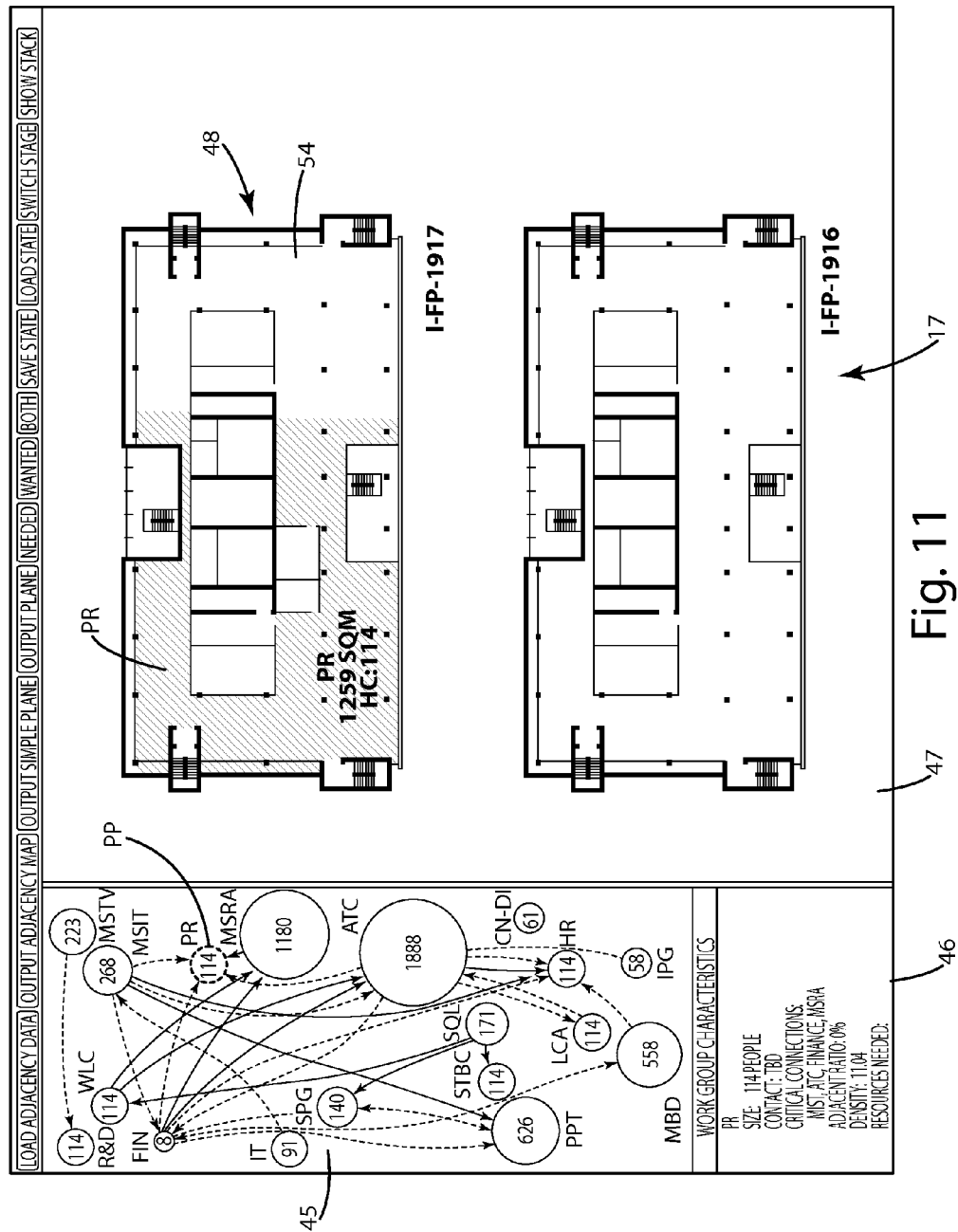
FIG. 11 illustrates the selected group dragged and dropped onto a floor plan as a block in a first desired spatial configuration.

Next, to assign a particular group to a selected floor 48, a selected group bubble such as bubble PR of FIG. 10 is dragged and dropped onto a desired floor plan 48. This is done with the input device, wherein the left mouse button can be positioned over the bubble PR in the bubble diagram 45, a mouse button is then clicked and held, and the bubble PR then follows the mouse cursor so as to be dragged and then dropped by releasing the mouse button onto a desired floor plan 48. As seen in FIG. 10, the Needed Connections 32 and Wanted Connections 33 follow the bubble to better track what other groups might preferably be located close to the PR bubble. In FIG. 10, the bubble PR is dragged, and then dropped in FIG. 11 so as to transform the bubble into a block located in floor plan 48 within the available work space 54. The size of the block PR is proportional to the headcount and desired density that is now shown in the Work Group Characteristics Pane 46, wherein the density after the drop is at 11.04. The illustrated block PR in the blocking diagram 17 has a label with the group name PR, the area used which is at 1259 square meters, and the headcount HC: 114. The block will automatically conform to the interior and exterior walls 51 and 50 so as to avoid overlapping interference or collisions with non-movable structures and other resources, such as meeting rooms. This sophisticated collision-detection process works with building space "contour" information obtained from initially loaded floor plans, but the user preferably is then able to change these contours, should there be physical changes to the available space (such as rearranging walls or other architectural elements in this planning stage of the building process).

Figure 12:
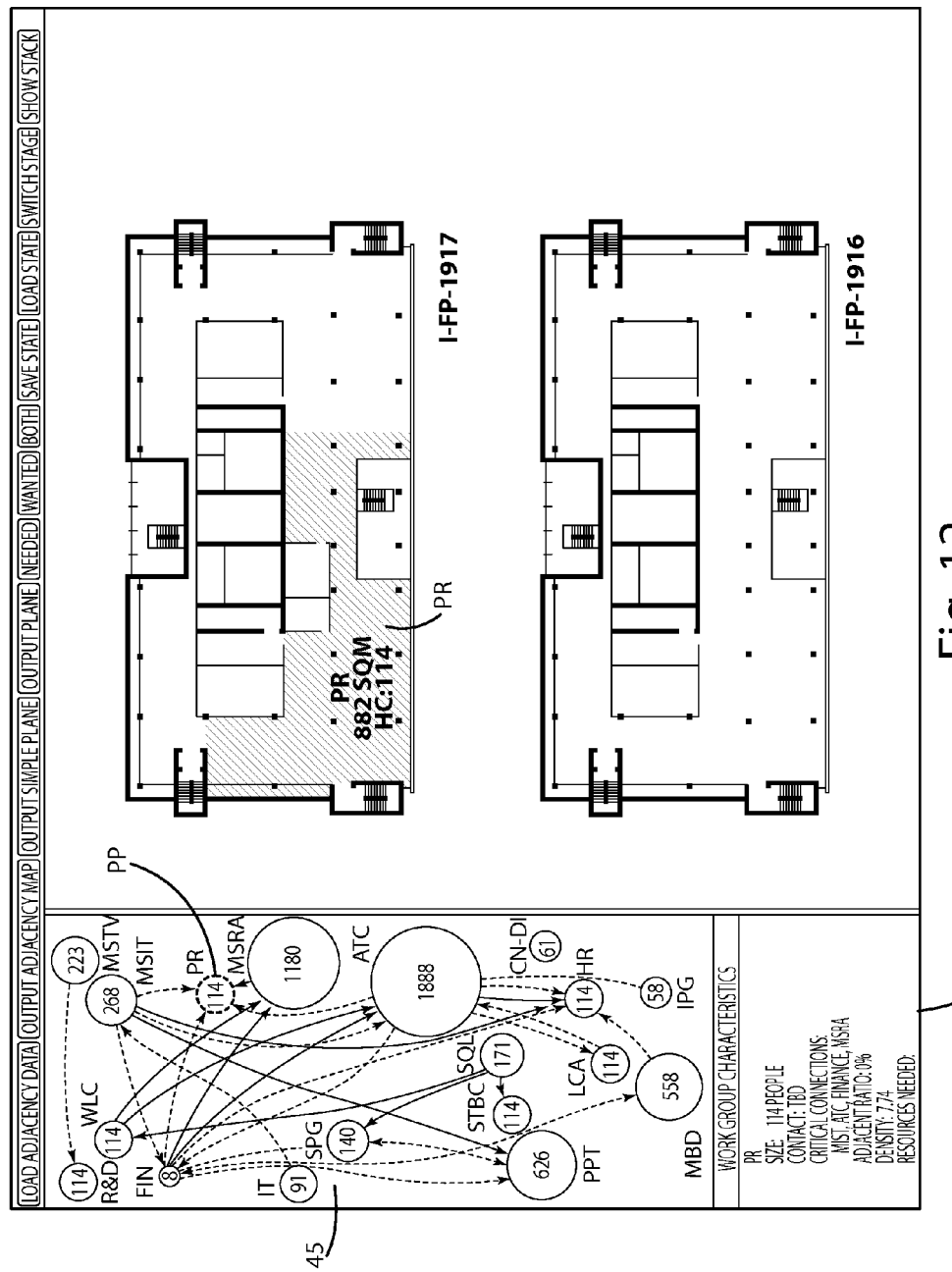
FIG. 12 illustrates the selected group modified into a second spatial configuration.

As seen in FIG. 12, once dropped, the block PR may be dragged further against the existing walls which will automatically change the shape of the block to conform to the existing structures, while preserving the approximate overall block area and density of area per person. By grabbing the edge of each block with the pointer of the input device (such as a mouse), the user can increase (to fill so-called "dead" or leftover spaces) or decrease (to try to "squeeze" a block to a smaller space) the size of the block, decreasing or increasing its density, respectively therewith. The density changes are then indicated in the Work Characteristics Pane 46, where a decrease under a pre-set (by user) threshold will change from a normal, acceptable color such as black in FIG. 11, to a warning color such as red in FIG. 12. In FIG. 12, the Density is indicated as 7.74 which is below the minimum threshold of 10 and indicates that the block configuration of FIG. 12 is unacceptable.

More particularly as to the collision detection, this feature allows for easy modification of the floor plans. When a bubble is dropped on a floor plan, it automatically transforms into a block with the size proportional to the group's (bubble's) size, calculated by the headcount and density. Then, the user can drag the block around, in which process the block will conform to all inner and outer building structures (such as curtain wall, core, etc.), called contours. This process is called collision detection, and highly valuable to ensure only useable space in the building will be occupied by groups. When the user imports floor plans, these contours are auto-detected based on previous input in the user preferred architectural software (such as CAD or BIM), and the user can also modify these contours in the inventive system. Dragging around a block preserves its approximate size, but the user can reform the block's shape (for example from a square to a rectangle) by pushing it towards an edge or corner of a floor with the input device. While reshaping a block, it will still retain its approximate size, which is preferred to preserve appropriate space for its headcount. However, the user can change the size of a block by grabbing its edge and modifying the size as described above.

Figure 13:
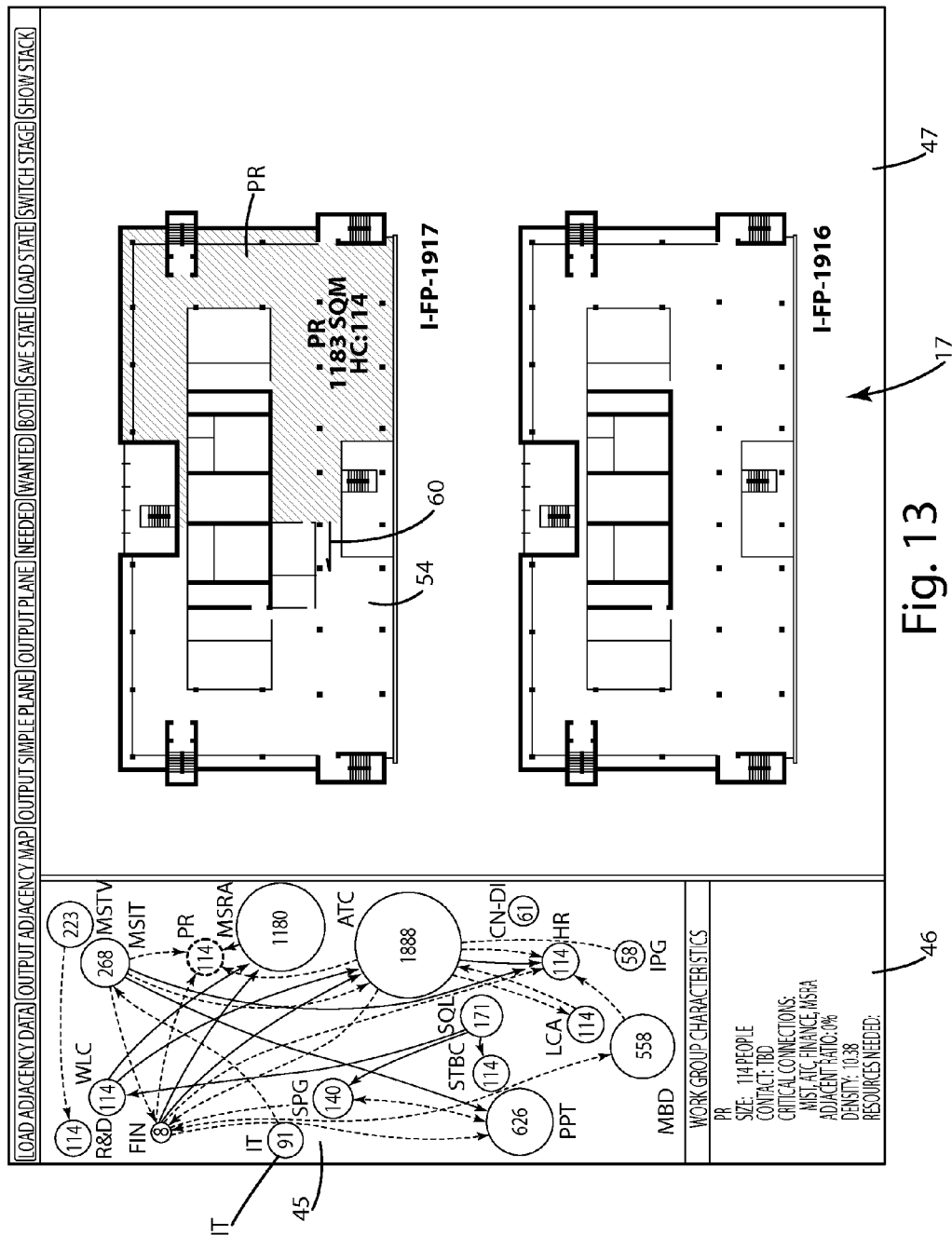
FIG. 13 illustrates the selected group moved or displaced to a third spatial configuration.

In FIG. 13, the PR block can be moved or dragged to a new location by holding the mouse button and moving the cursor and block to the new location. In FIG. 13, the block density is now reset to 10.38 square meters per person which returns the Density display color to the acceptable color which is black.

Once the PR block is dropped, the PR block in the block diagram 17 has a unique color associated therewith, such as a light blue, wherein after dropping, the PR bubble in the bubble diagram 45 also changes from the initial white color or the active grey color to the unique color, such as light blue. As such, the PR bubble and the PR block are color coordinated with matching colors that visually indicates that the group has now been placed in the block diagram 17.

Each group has a unique color associated therewith (based on initial auto-assigned or user-defined color coding), such that placement of the group on a floor plan 48 causes the bubble to change to its assigned color. Therefore, when looking at the bubble diagram 45, it is easy to identify which groups have been assigned to a space in the block diagram 17. The block diagram 17 of FIG. 3 also shows this color identifier, such that the building planner and client can easily determine which bubbles are the initial white color and still need to be placed on the floor plans 48.

Figure 14:
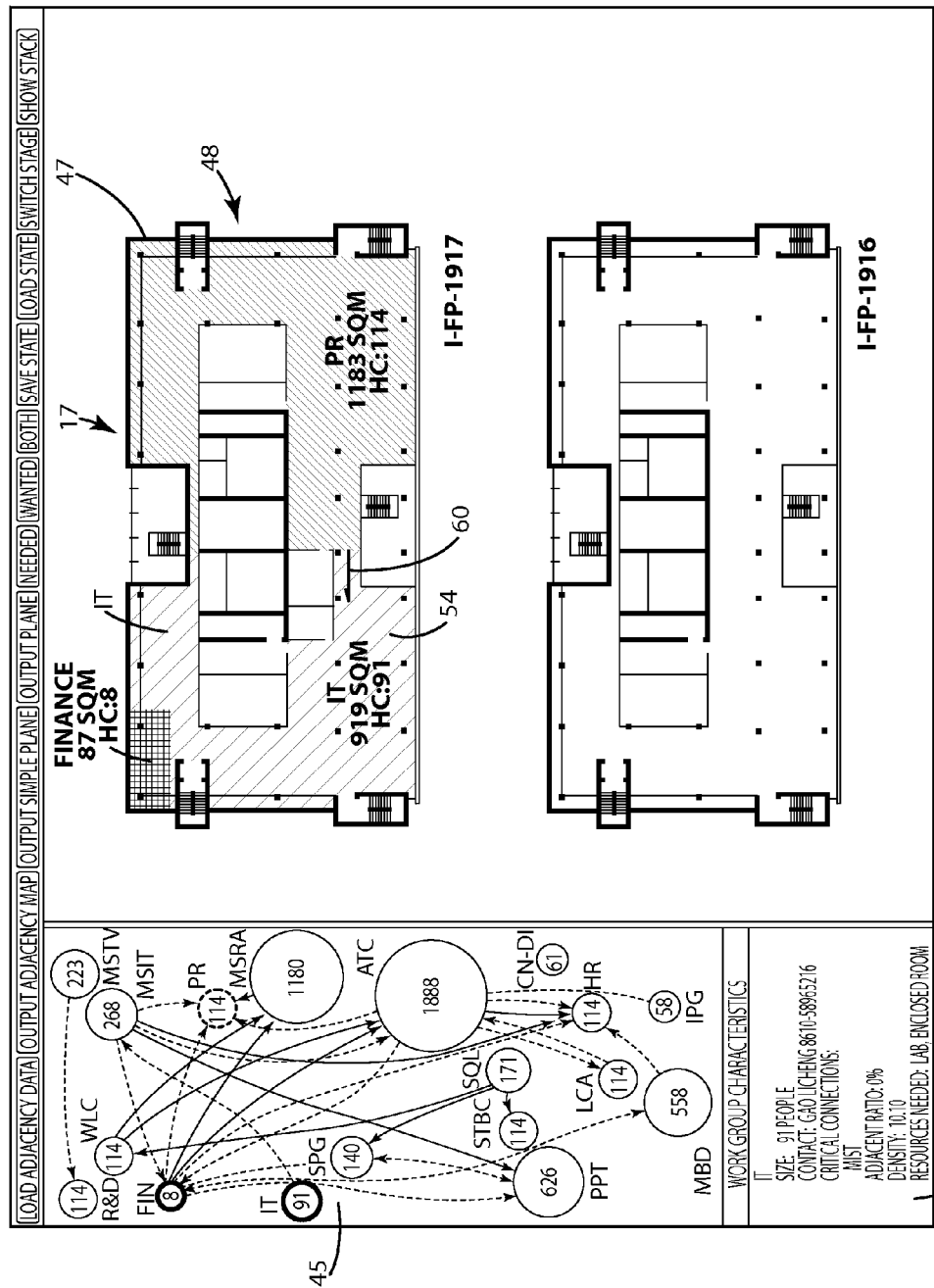
FIG. 14 illustrates the selected group in the third spatial configuration with two additional groups being selected and dropped onto the floor plan.

FIG. 14 shows the floor plan 48 after the FINANCE and IT groups have been dropped on or assigned to the same building floor or space. These blocks automatically conform to the existing walls and will not overlap with an assigned block such as PR. These blocks FINANCE and IT and their associated bubbles then change to their respective assigned colors such as light yellow and red. For these smaller groups, space assignments are relatively easy since these groups can fit completely into a single floor with other groups. The spatial size and density can be readily adjusted by the mouse to fit each group.

Figure 15:
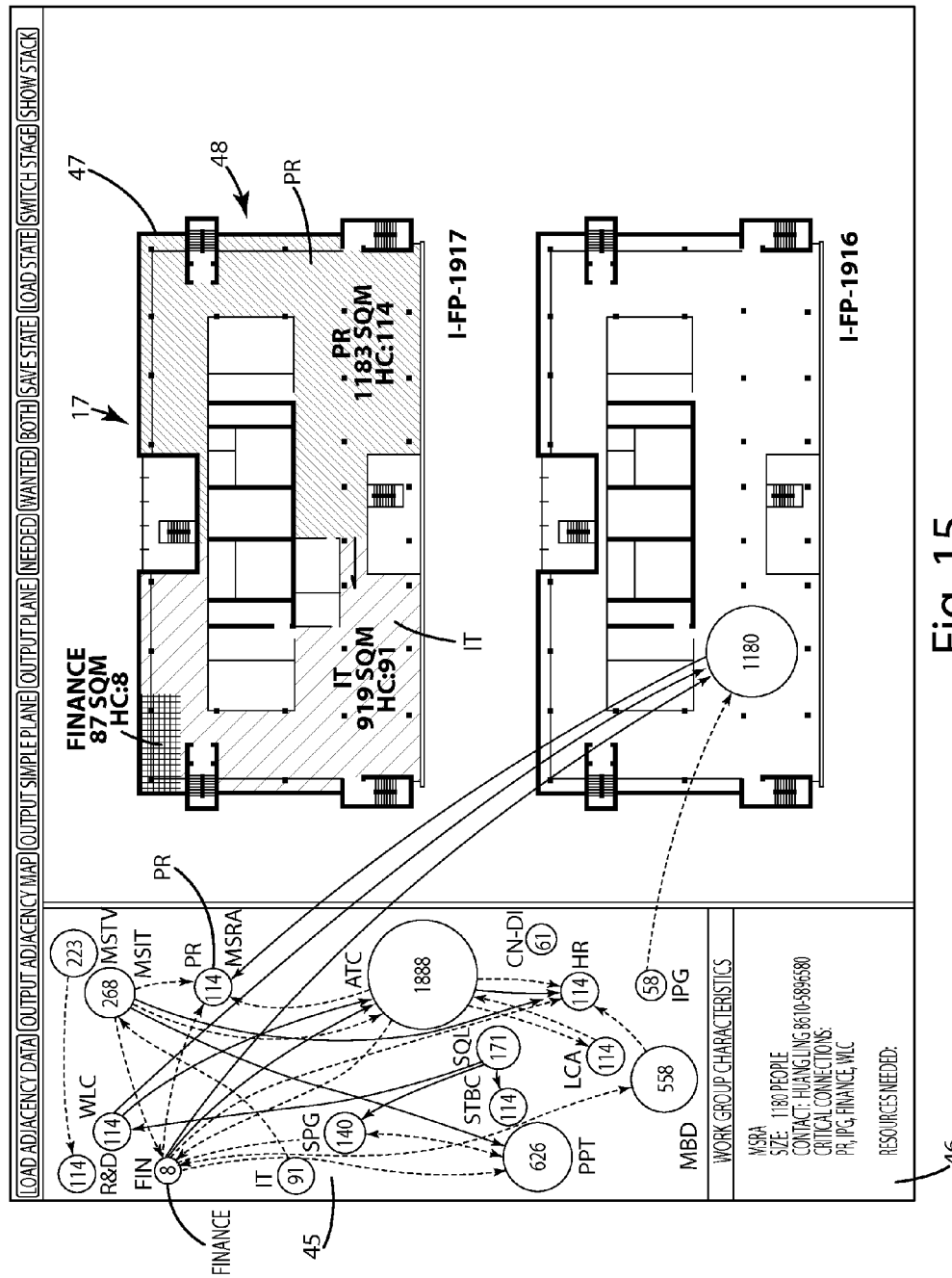
FIG. 15 shows a next selected group being dragged over a further floor plan by the input device, such as a mouse.
Figure 16:
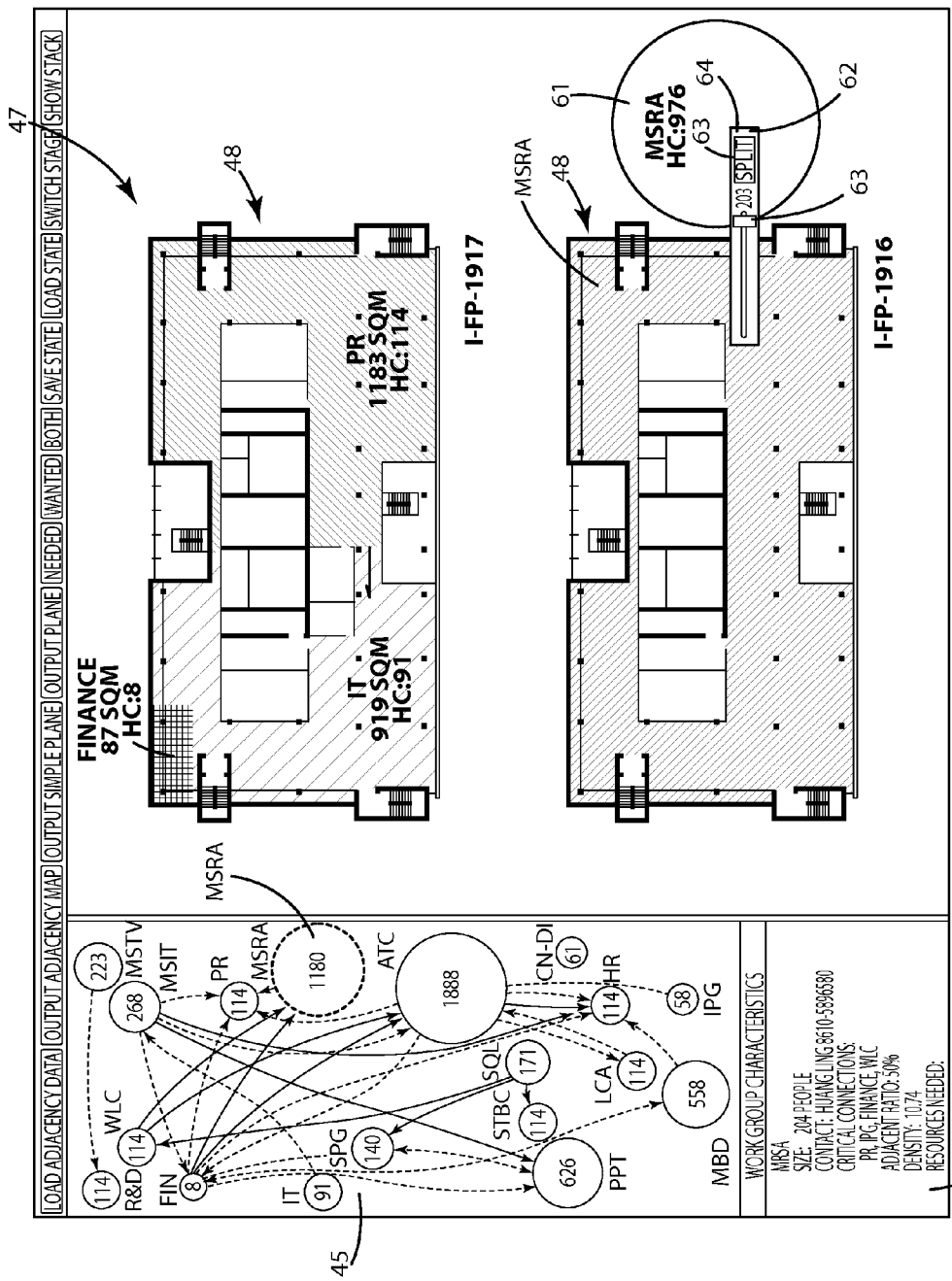
FIG. 16 illustrates the selected group of FIG. 15 as a block after being dropped onto the floor plan and a remainder bubble showing the remaining personnel for such group which require placement in additional locations on other floor plans.

The planning system 10 also can readily accommodate large groups having headcounts (thus space requirements) which exceed the maximum head count (thus space requirement) of one or more floors or the available space remaining on a partially filled floor. Referring to FIG. 16, the MSRA group has a headcount of 1180 which greatly exceeds a normal maximum floor capacity of about 200 personnel. If the stacking diagram 18 is turned on, the planner can see the total capacity of each floor and select the floors with the most suitable capacity and a number of empty floors located close together that can handle all of the organizational group. For example, the MSRA group would need to use more than five floors at full capacity or maximum head count, or possibly more floors if the density is adjusted to provide more workspace for each person. The planning system 10 automatically handles this by allowing a large bubble such as MSRA to be dragged and dropped on a floor having an inadequate total capacity. When this happens as in FIGS. 15 and 16, the floor is filled with the MSRA block, which has a density of 10.74 as indicated in the characteristics pane 46. The excess or remaining headcount is then shown in a free remainder bubble 61 which is automatically created in the white space of the planning pane 47 next to the actual floor plan. The remainder bubble 61 maintains the same group name MSRA but shows the remaining headcount of 976 that exists after a headcount of 204 is assigned to the floor plan 48. This bubble 61 has the same unique color identifier as the block MSRA and the associated bubble MSRA in the bubble diagram 45. Also, preferably the original correspondent bubble on the bubble diagram will inform the user graphically (for example it can turn to a pie-chart) that some percentage of it still needs to be allocated to a space on one of the floor plans.

As will be described below, the remainder bubble 61 may be dragged over another desired floor plan 48 with the mouse, such as the next successive floor 48 in FIG. 16. Alternatively, the input device can be used to place the cursor over the remainder bubble 61 and then the mouse button clicked to open a split box 62 that will split the remainder bubble 61. The split box 62 has a sliding scale 63 that defines the headcount being split off from the remainder bubble 61, and a split button 64 that activates the split.

Figure 17:
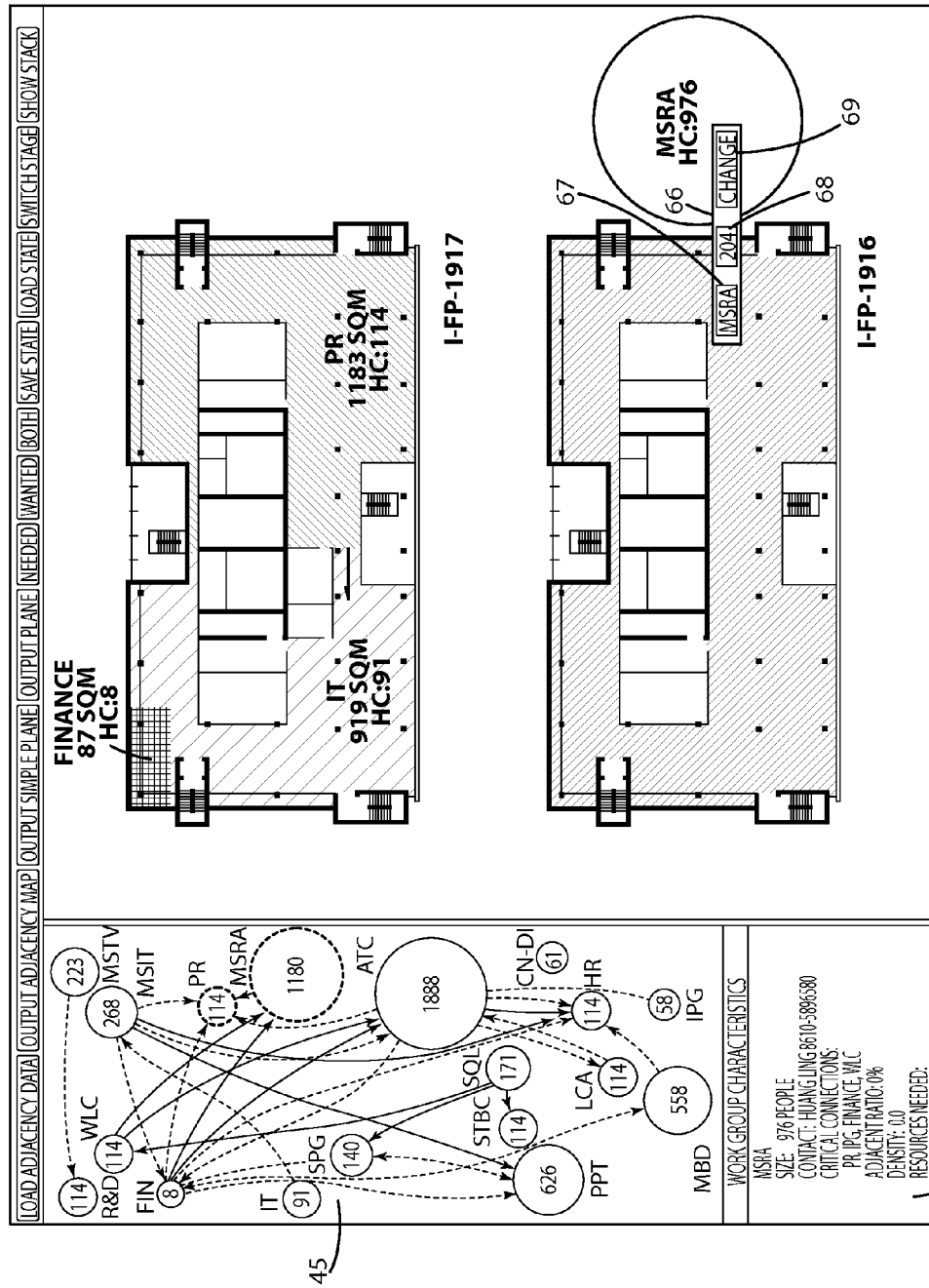
Figure 19:
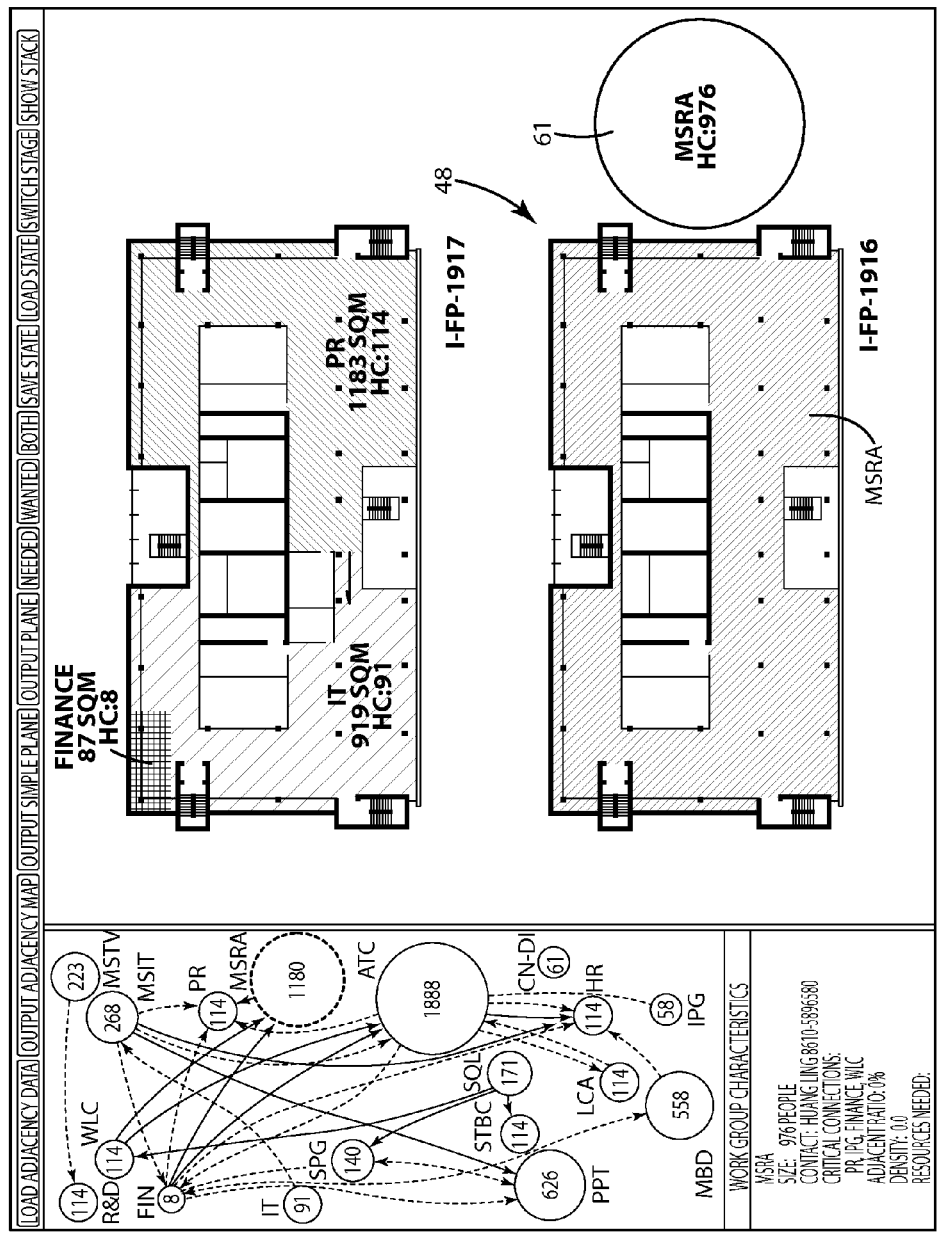
FIG. 19 illustrates the floor plan after such data change.

Also, in FIG. 17, the headcount of the existing block may be changed by clicking the mouse over the block to open a change box 66 which allows the group name 67 to be modified, the headcount 68 to be modified, and a change button 69 to activate the change. This may be desirable to change the density if the floor space is entirely used. FIG. 19 shows the change to block MSRA after the change button 69 is clicked to change the head count on floor 1916 to 180 persons.

Figure 20:
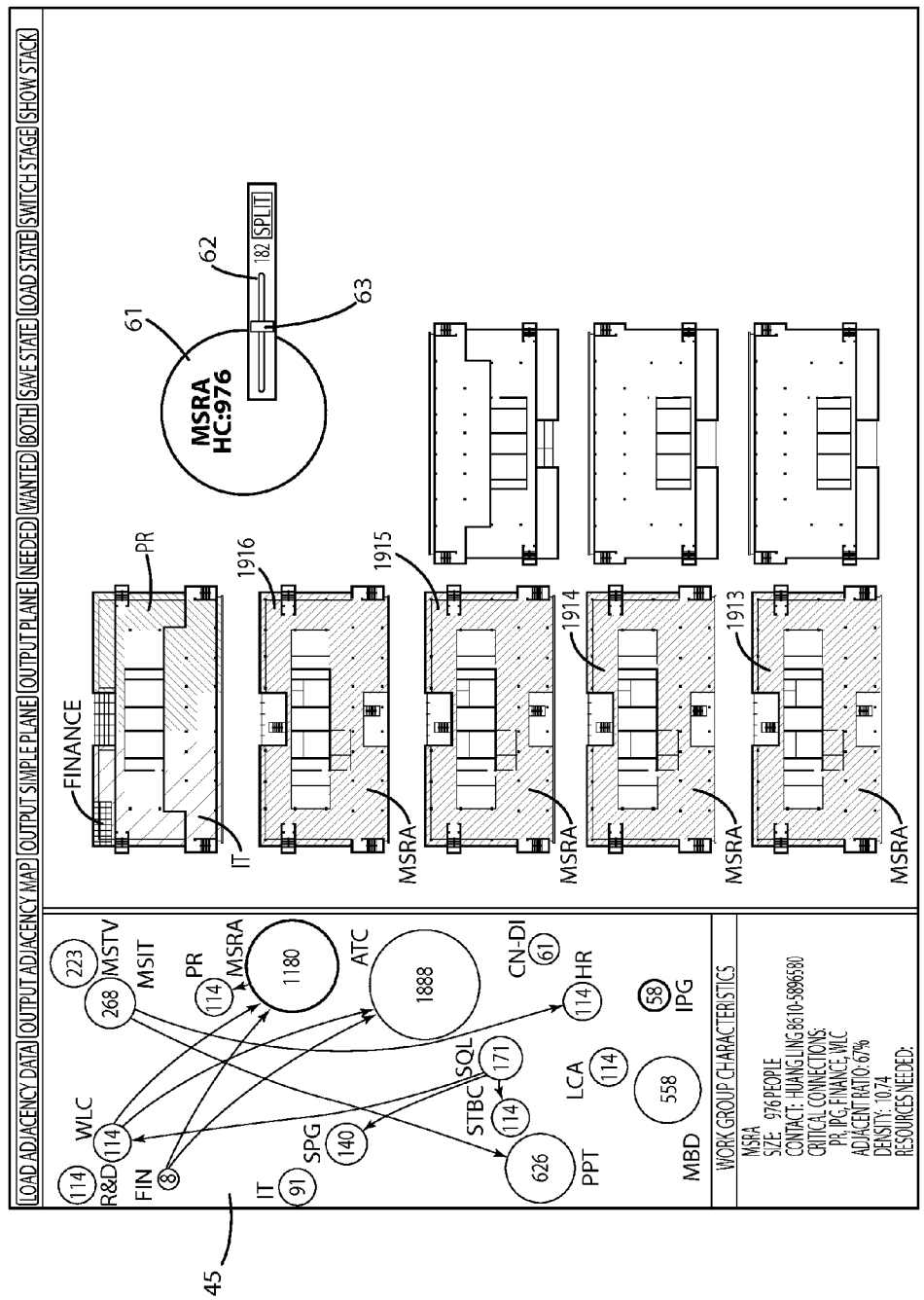
FIG. 20 illustrates additional floor plans having subgroups of personnel from the selected group being distributed thereon and showing the remainder bubble which still requires distribution or placement on an available floor plan.
Figure 21:
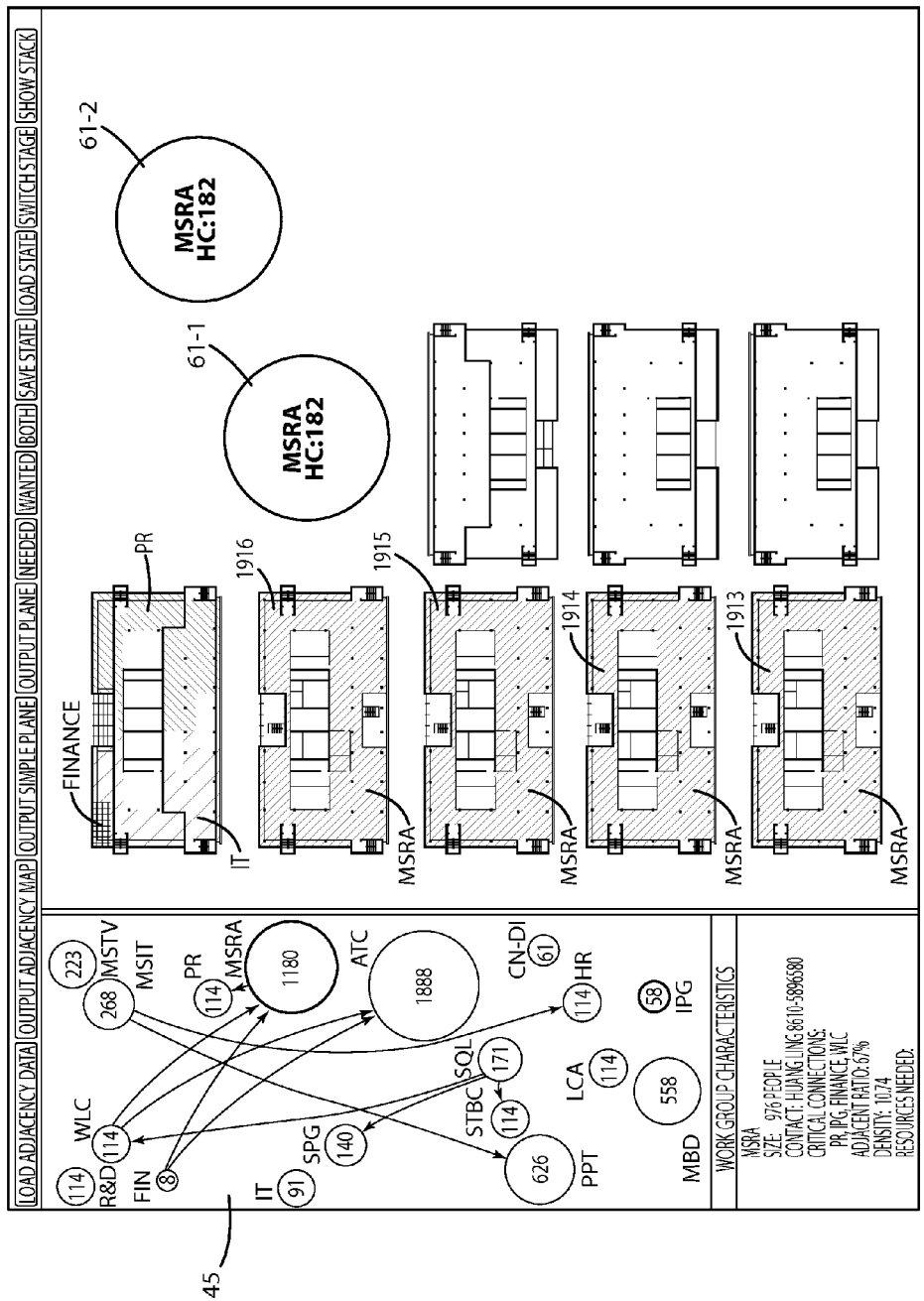
FIG. 21 illustrates two remainder bubbles after splitting of the remainder bubble of FIG. 20.
Figure 22:
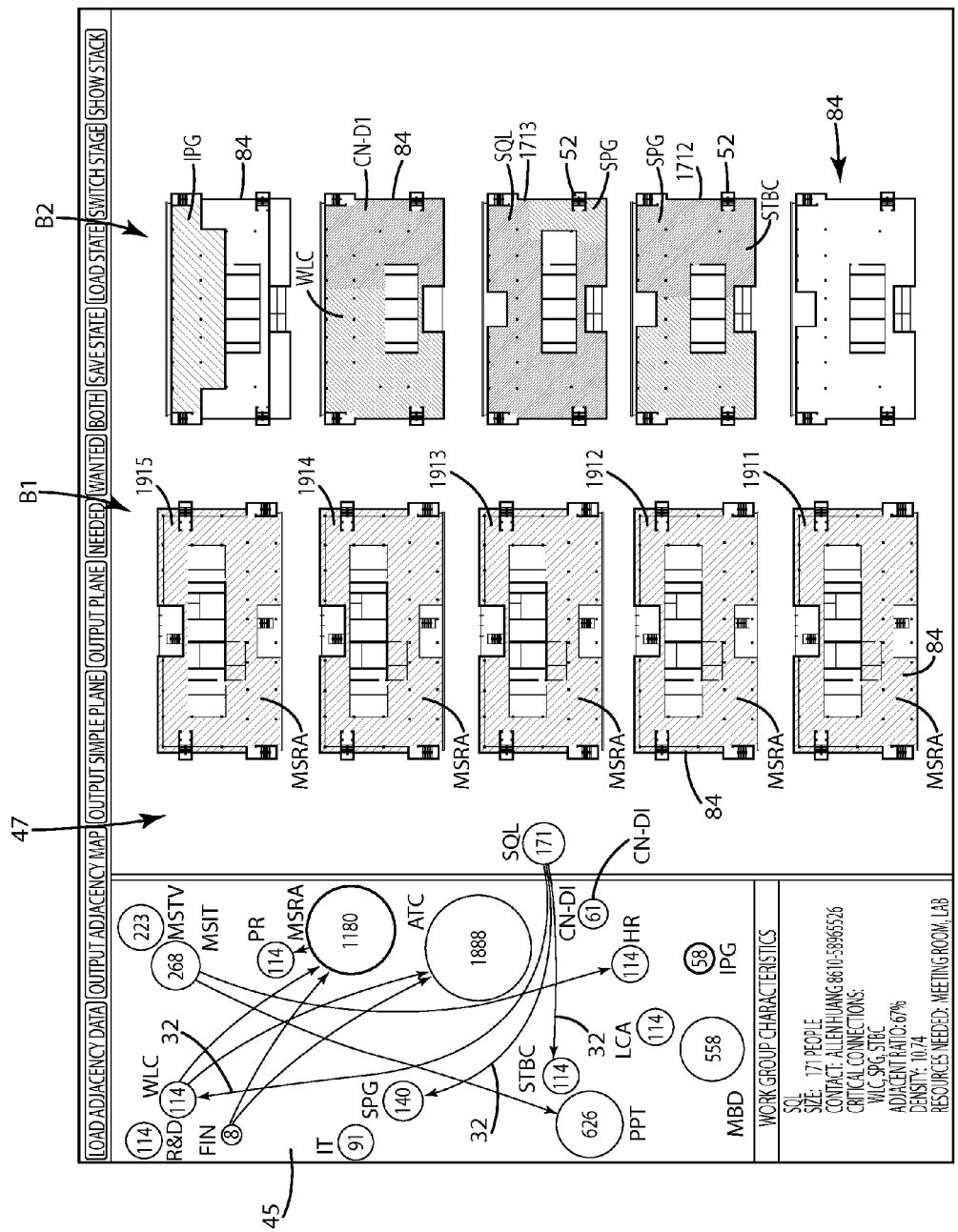
FIG. 22 illustrates additional levels of floor plans after distribution of the group shown previously and the addition of a further group.

While the split box 62 is provided, the remainder bubble 61 may simply be dragged with the mouse and dropped onto additional floors 1915, 1914 and 1913 as seen in FIG. 20 which causes the headcount on remainder bubble 61 to progressively decrease, wherein the remaining headcount has now dropped to 364. This process continues until all of the remainder is assigned to a new floor plan. In FIG. 21, the remainder bubble 61 is split with the sliding scale 63 of split box 62 (FIG. 20) to form two remainder bubbles 61-1 and 61-2 having head counts of 182, which can then be dropped on different floors 1912 and 1911 as seen in FIG. 22. In FIG. 22, the groups for IPG, CN-DI, SQL, SPG and STBC are shown dropped or assigned to different floor plans which also changes the color identifiers in the bubble diagram. In particular, as seen in FIG. 22, the SQL bubble from the bubble diagram 45 can be dragged into the planning pane 47 to visualize the needed connections 32 and allow the building planner to better visualize the next steps. In this regard, the SQL group can be placed on floor 1713 and then the adjacency is maintained by dropping the groups STBC, SPG and WLLC above and below the SQL group on floor 1713. Since the SQL group did not take up the full floor space, the SPG group is shown as being split between floor 1713 and floor 1712. This provides the needed connection with the SQL group, and by physically locating the SPG group next to a stairwell 52, personnel of this group can readily access with their group personnel on a different floor. Since the CN-DI group and the IPG group are indicated in the bubble diagram 45 as being fairly independent relative to the other groups, these groups can be used to fill additional space in building B2 on the same floor as and the floor above the WLC group. This may be one proposal for placement of groups when developing the building plan.

Preferably, the max headcount that a floor can 'handle' is displayed on the stacking diagram. However, the tool is not limited to such function. More particularly, all groups may have the same or similar density which may change slightly as they are dragged around the floor plans, like 10-11 square meters per person. As such, the system displays the max headcount for each floor. However, some projects will have departments each with a different density (e.g. engineering or executive departments will most likely have smaller density—more space per person—than customer service groups such as call center groups, with higher density—less space per person. In this case, it may be difficult to display a max number of headcount at each floor: the system simply may not know which department the user will place there: if engineering, the user can have less headcount, if customer service, the user can end up with more, to illustrate this with the above example. So the user can preferably toggle between what is displayed at each floor on the stacking diagram: maximum headcount or maximum space (square meters or square foot), both of which create a limit to each floor and is called the capacity line.

Figure 23:
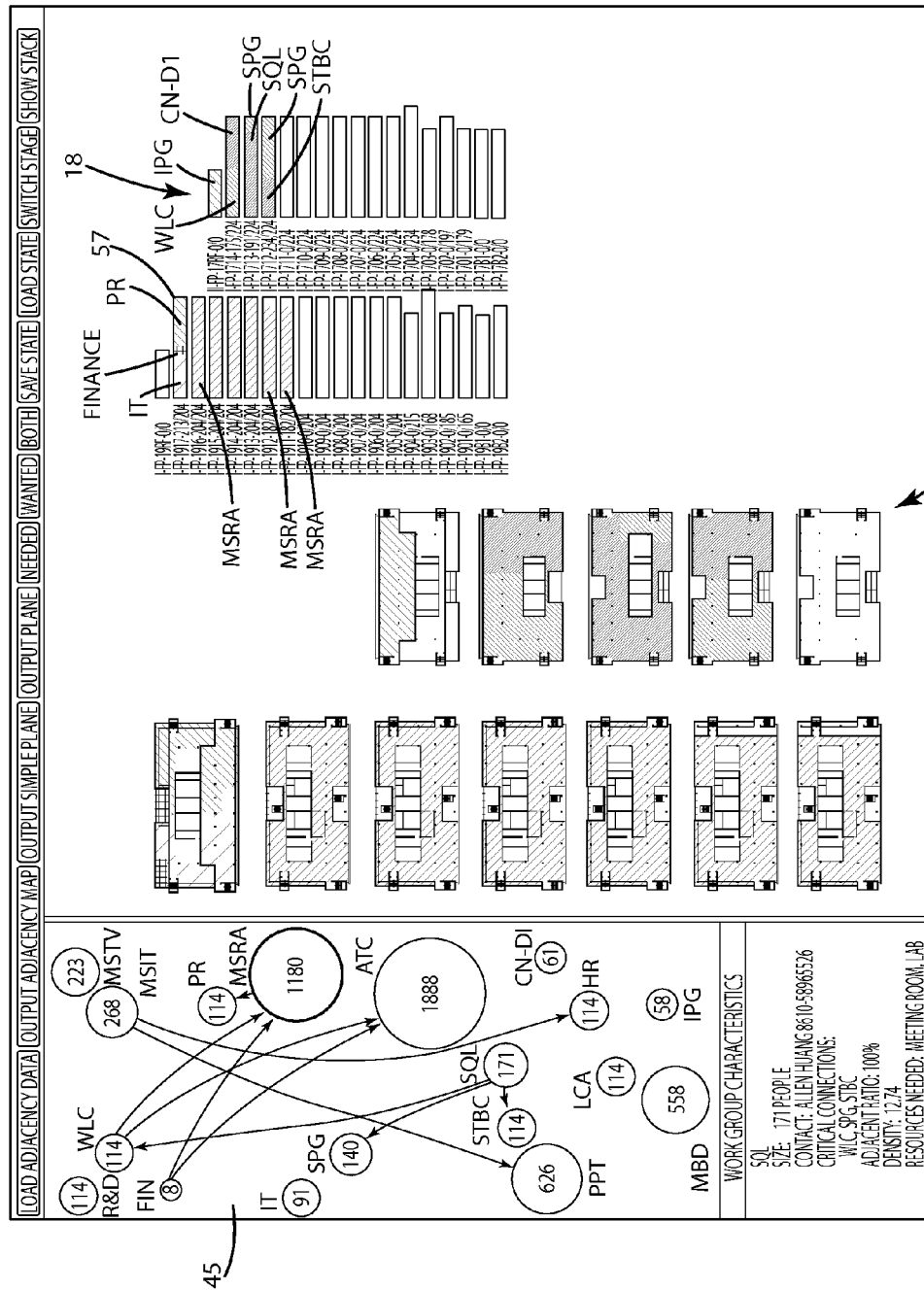
Figure 24:
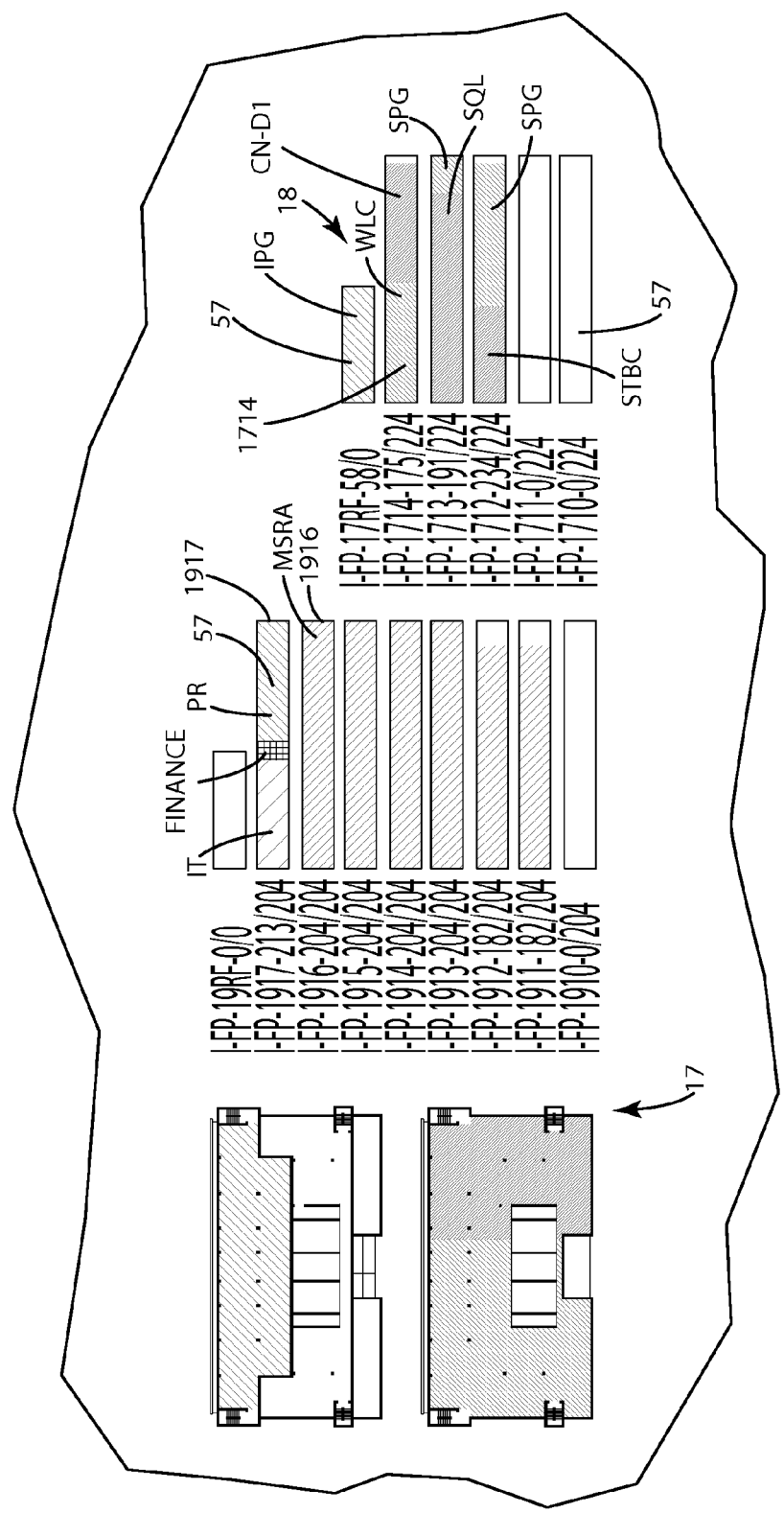
FIG. 24 is an enlarged partial view of FIG. 23.

To visually identify the placement of the groups, the stacking diagram 18 may also be shown simultaneously with the blocking diagram 17 as seen in FIG. 23. In this figure, the bars 57 are now provided with color coordinated shading that corresponds with the shading of the blocks assigned to that floor plan. Unfilled floors maintain their original color, namely white. The bars 57 associated with filled floors are filled proportionately with the color-coordinated shading as seen in FIGS. 23 and 24. Unfilled space is shown as white on the partially-filled floors, and also, the head count numbers automatically change to reflect the total number of assigned head count versus the maximum head count. For example, floor 1916 has a head count of 204 which indicates the maximum capacity associated with the maximum head count of 204. Floor 1714, however, has a current head count of 175 which is below the maximum head count of 224. For diagrammatic purposes, floors 1917 and 1712 respectively have head count ratios of 213-204 and 234-224 which would indicate that while the density ratios are acceptable, the total head count assigned to a floor is now excessive which may then require some adjustment to other floors to avoid the excessive head count.

Also, the user can click on a stack on the stacking diagram (which represents a group on a given floor) with the input device, and the system pans the blocking diagram pane to show the respective floor.

Figure 25:
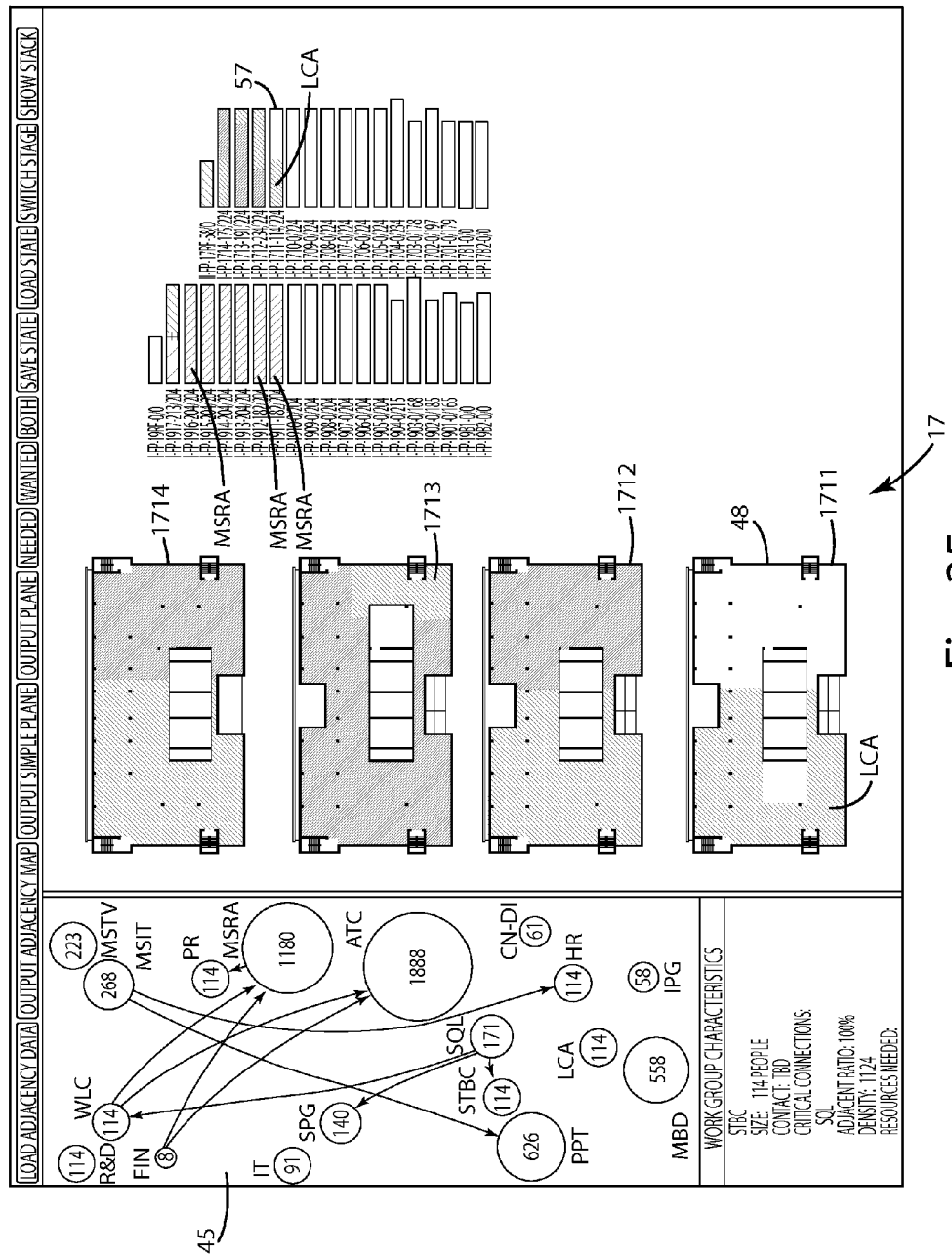
FIG. 25 illustrates a further group distributed on a floor plan and a first highlighted display of the connected bubbles in the bubble pane.
Figure 26:
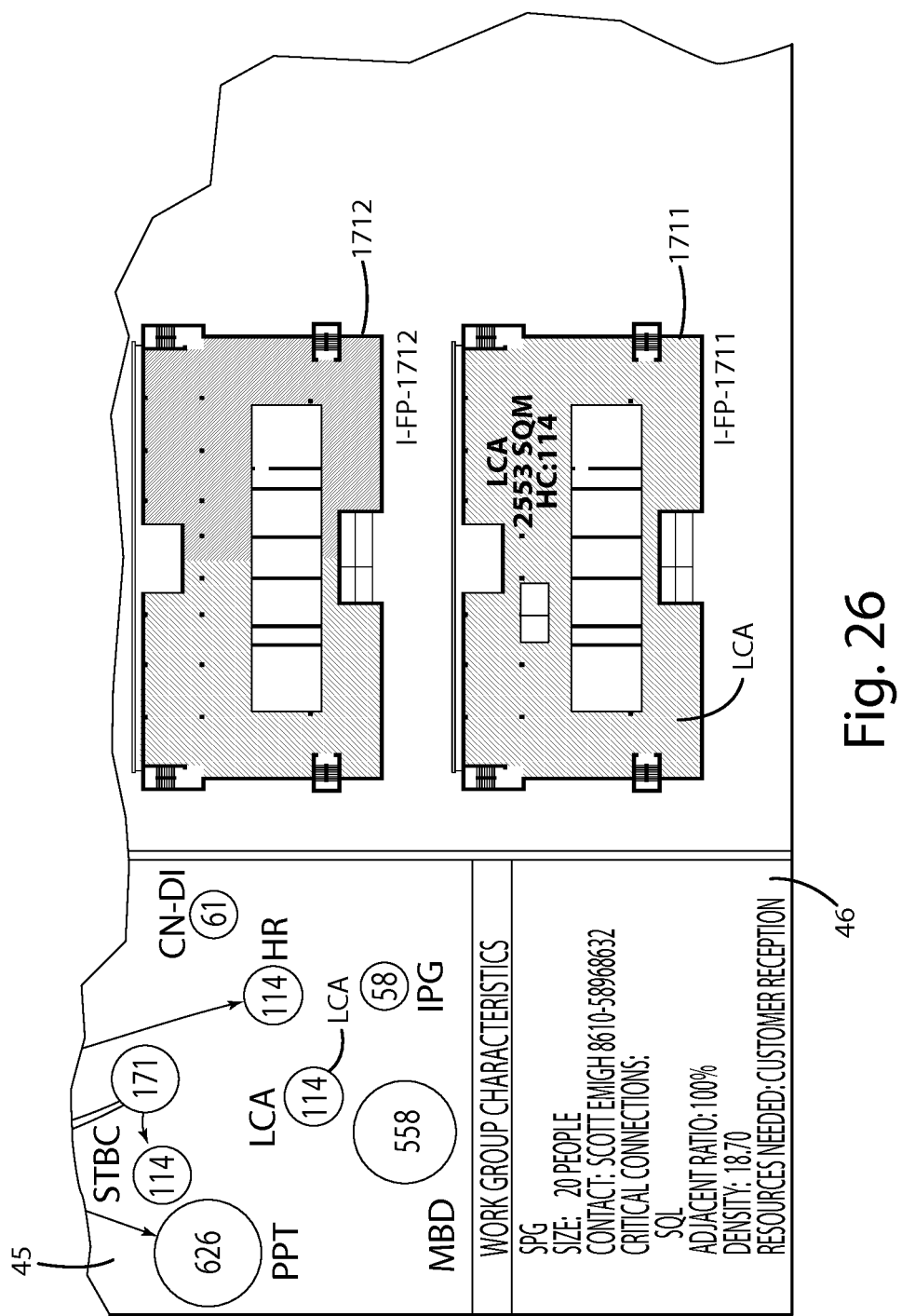
FIG. 26 illustrates a selected floor plan enlarged or zoomed in with the group block in a first spatial configuration.
Figure 27:
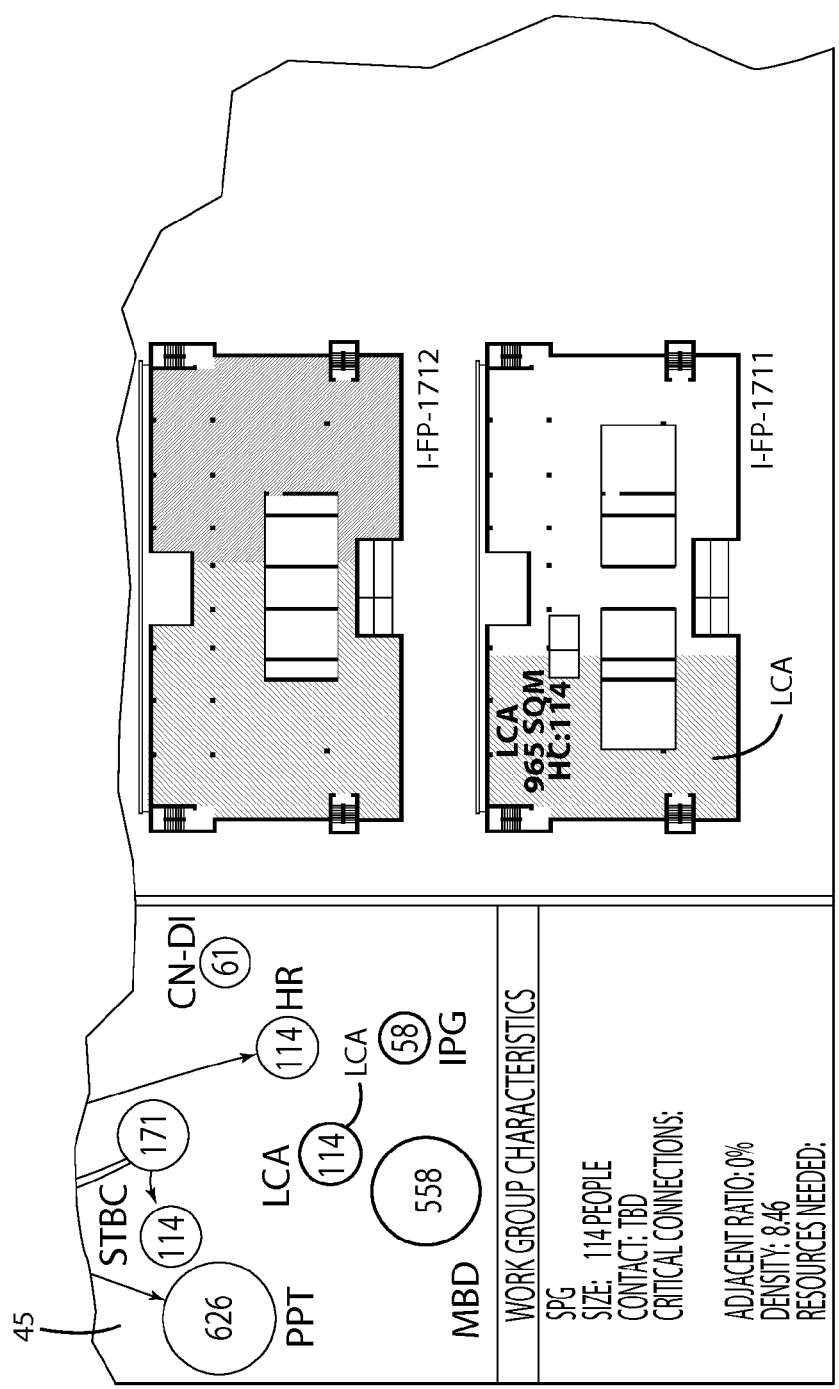
FIG. 27 illustrates a further display state of FIG. 26 with the group block in a second spatial configuration.

FIGS. 25 and 26 show the additional group LCA dragged and dropped on floor plan 48 of floor 1711 which then fills in the color in the bar 57 in proportion to the amount of floor space that has been filled. Notably, FIGS. 25, 26 and 27 show variations in the floor space used, wherein the density in FIG. 25 shown at an acceptable level of 11.24, and FIG. 2 shows the LCA block expanded to a density of 18.70 which covers all of floor 1711. After adjusting the spatial configuration of block LCA, FIG. 27 shows an unacceptably low level of 8.46.

Further, once any group is placed, such as group WLC, the WLC block in block diagram 17 can be clicked to show the adjacency ratio in the group characteristics (also called dashboard) pane 46. This adjacency ratio is determined by a number of needed connections for the WLC group as indicated by the number of needed connections 32 shown in the bubble diagram pane 45. It is noted that after the above-described placement of the various groups including the WLC group, the WLC group on floor 1714 only has a direct connection with a single needed group, namely the SQL group on floor 1713. The WLC group, however, does not have a direct connection to the other needed groups, namely the SRA and ATC groups such that only one of the three needed connections is accomplished by the proposed floor plan developed at this stage. Hence, a building planner may thereby decide to readjust the plan. In one example, this factor may come to light during a meeting with a client organization, and changes may then immediately and dynamically be made to the floor plan shown in FIG. 28 to attempt to create a higher adjacency ratio for the WLC group. In one respect, the WLC group is located in building B2, while the MSRA group is located on similar floors but in building B1 which thereby may make the illustrated placement highly undesirable. Therefore, immediate and dynamic changes might be made to the proposed plan in a meeting with the client organization, or possibly prior to such meeting as the building planner develops the next proposal.

Figure 28:
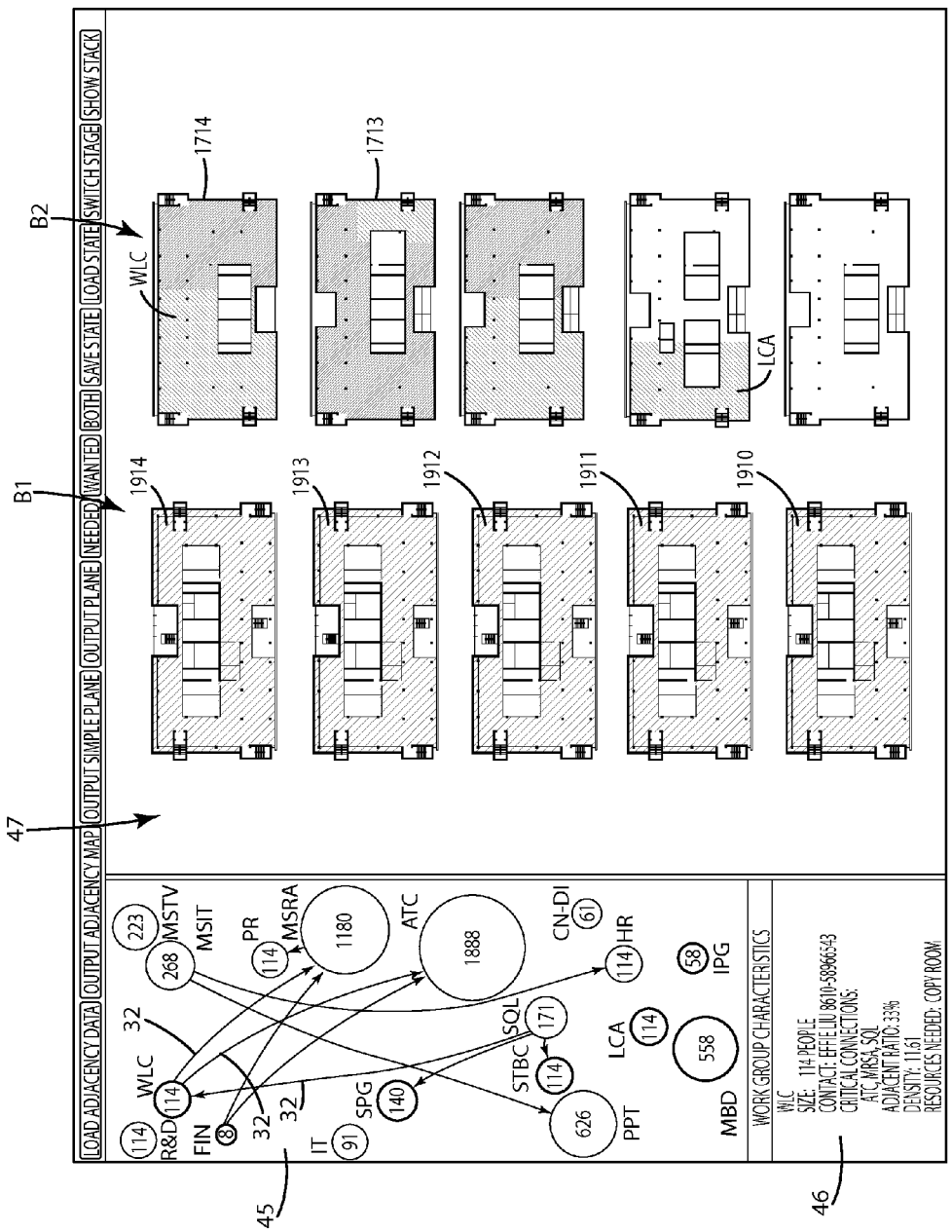
FIG. 28 illustrates the WLC block activated to highlight related bubble connections in the bubble diagram.
Figure 29:
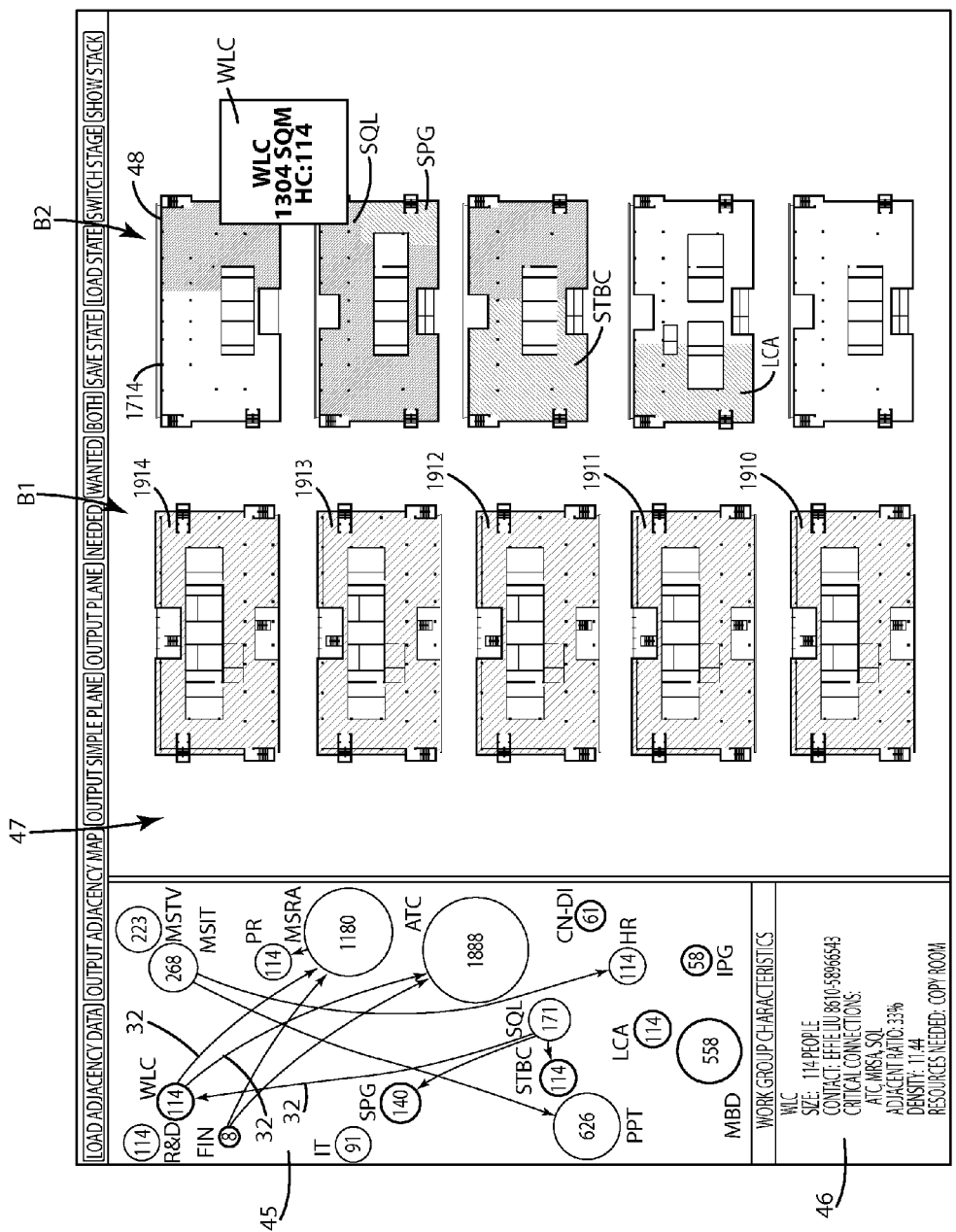
FIG. 29 illustrates the removal of the WLC group block from one floor plan.
Figure 30:
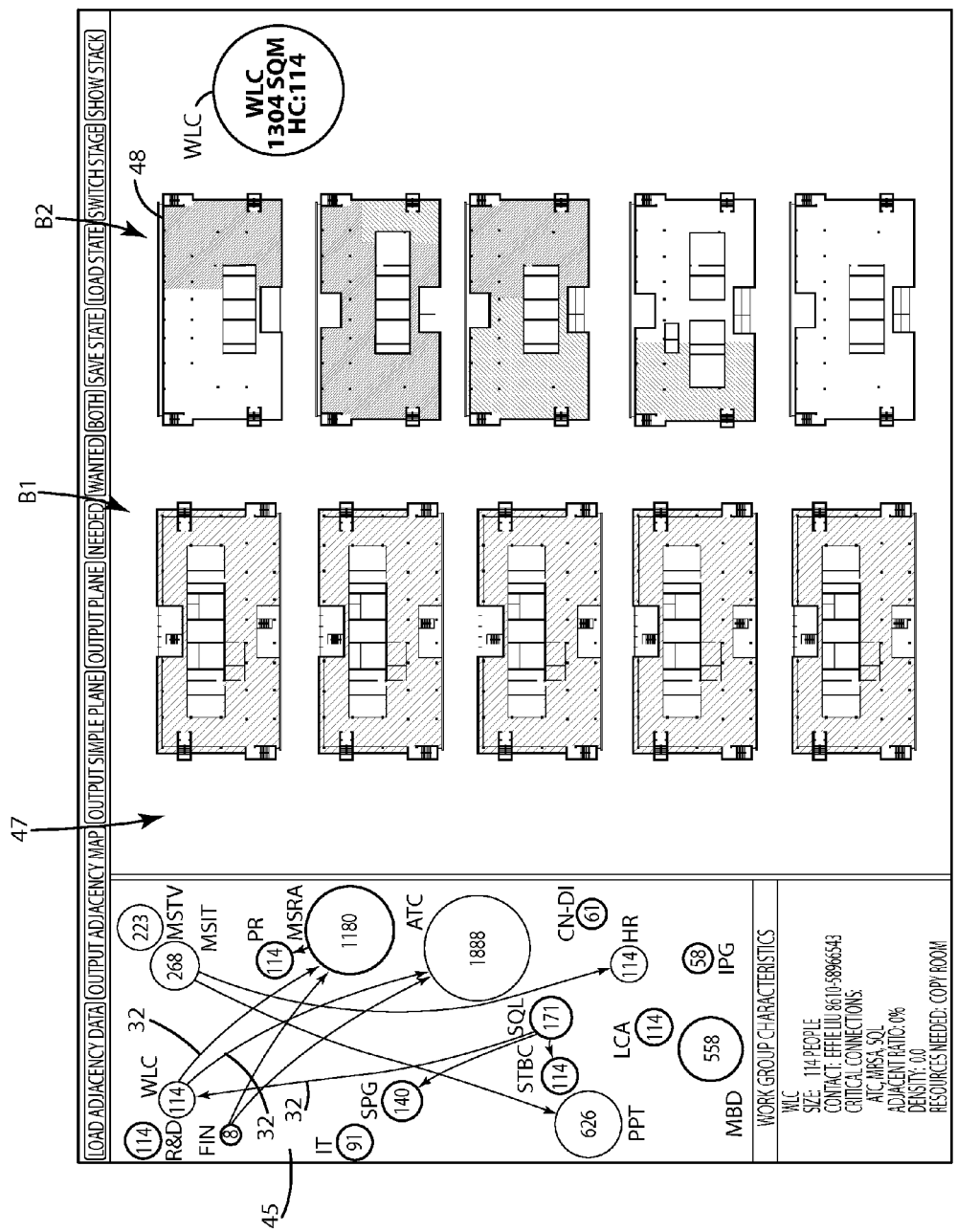
FIG. 30 illustrates the removed group as a free bubble in the main planning pane.

As to FIG. 29, it also is possible to remove a group and move same to another location. For example, assigned group WLC is shown in the process of being removed from a floor plan 48 for floor 1714. This is accomplished by holding a keyboard button (preferably the "control" or "ctrl" button) and then holding the mouse button down which releases the WLC block from the floor plan 48 as seen in FIG. 28, and then dragging and dropping the removed block in the adjacent screen space which converts the block to a free bubble WLC as seen in FIG. 30. This bubble WLC is now available for reassignment to a new floor plan or location.

Figure 18:
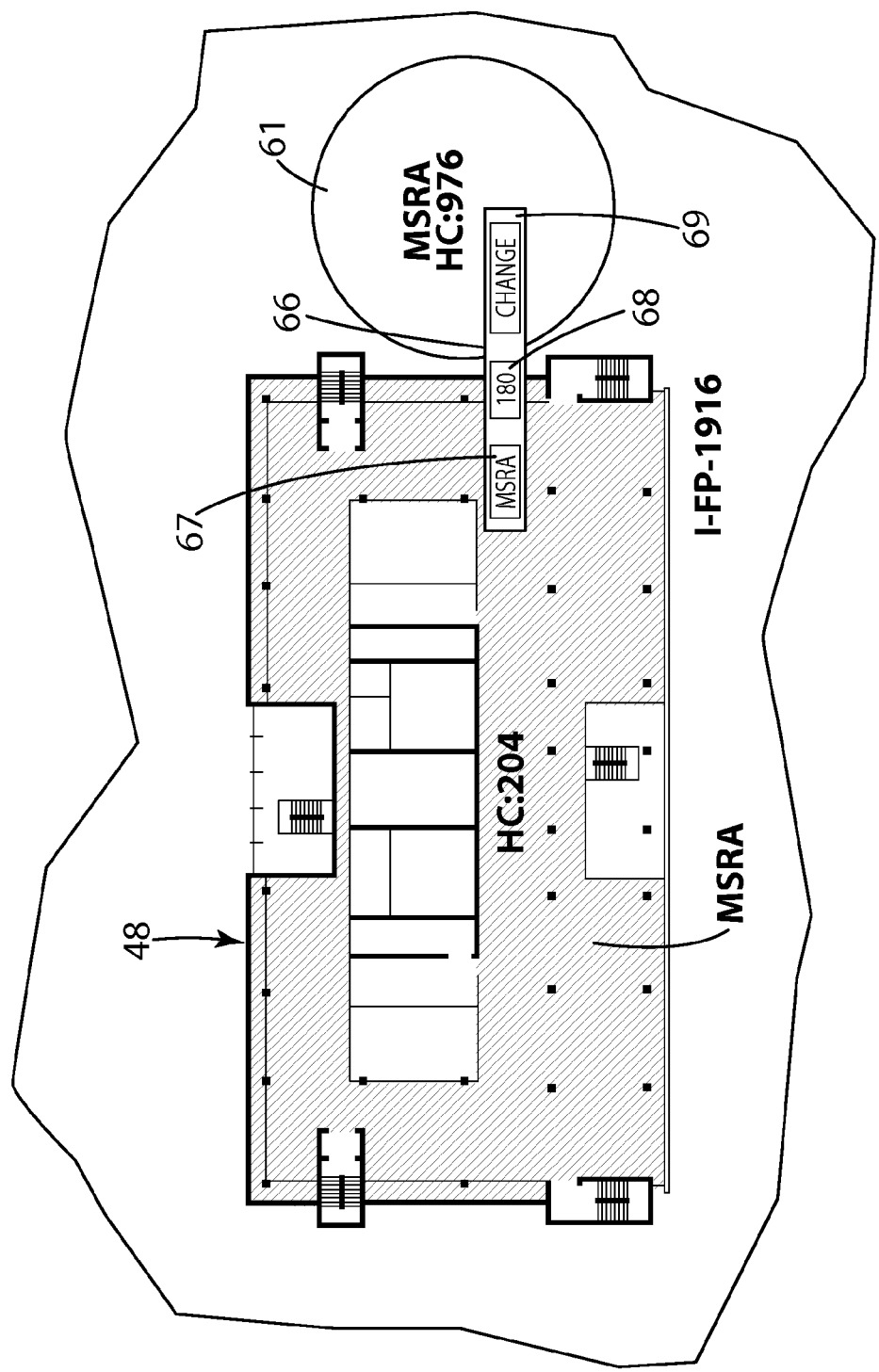
FIG. 18 is an enlarged view of FIG. 17 which illustrates the data change box being modified.
Figure 31:
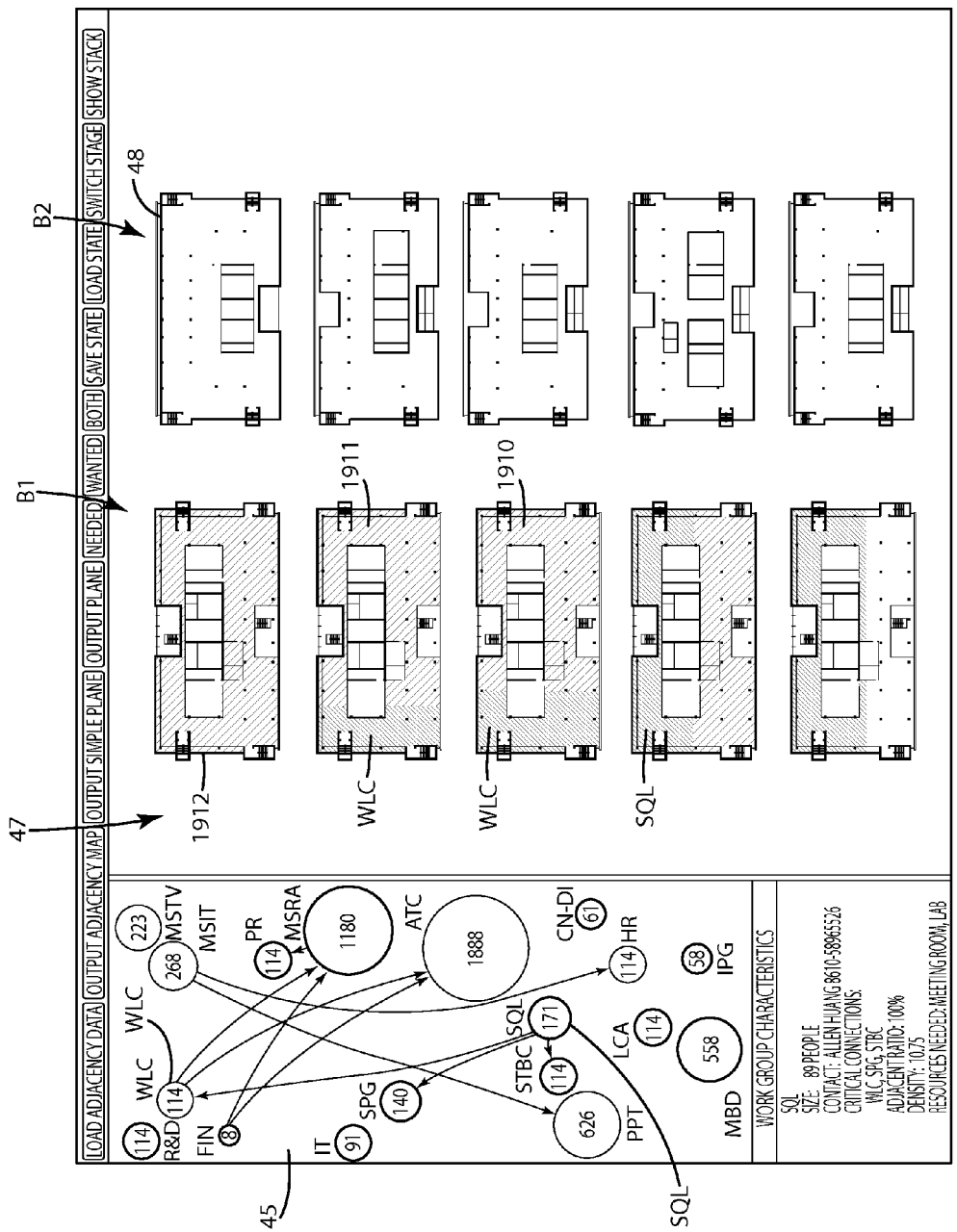
FIG. 31 illustrates a modified block diagram with various group blocks being moved to new locations, which is representative of dynamic modifications permitted by the planning system.
Figure 32:
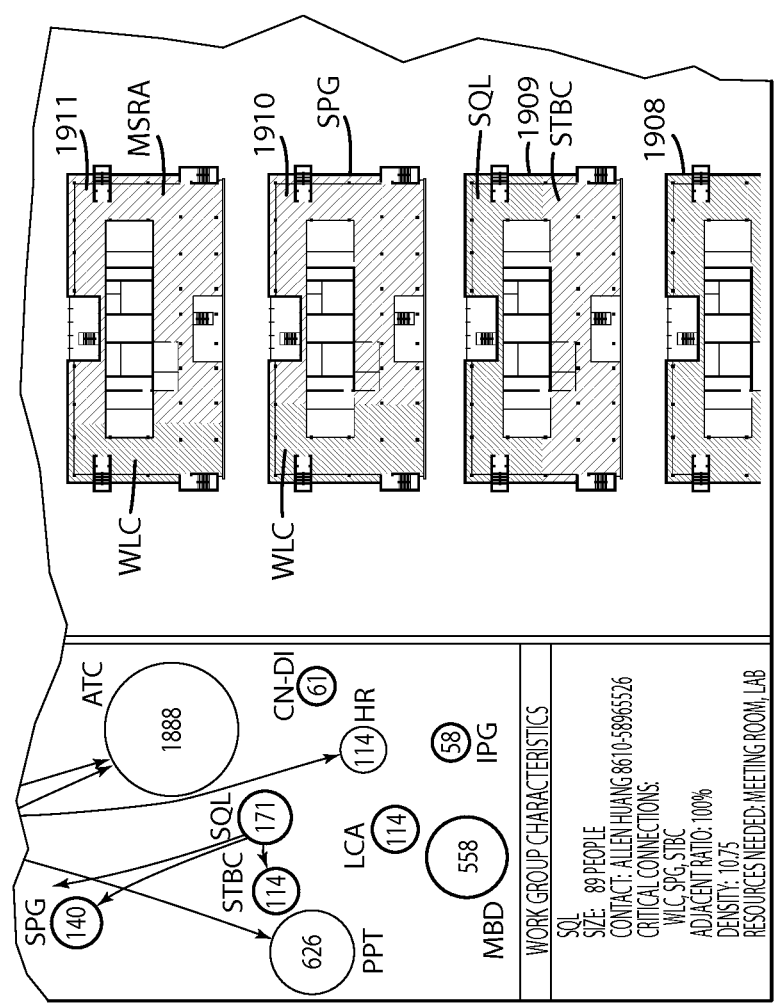
FIG. 32 is an enlarged partial view of FIG. 31 showing the SQL block activated and the work group characteristics thereof.

Referring next to FIG. 31, the WLC bubble of FIG. 30 is next dragged and dropped to a desired location and in this regard, it is dragged and dropped onto floors 1911 and 1910 as seen in FIGS. 31 and 32. This creates the needed adjacency with the MSRA block previously assigned to floor 1911. Since the head count for the MSRA blocks on floors 1911 and 1912 were previously set to a head count of 182 as described above relative to FIGS. 21 and 22, it then becomes desirable to change the head count on these floors to a maximum head count of 204 on floor 1912 and a lower head count to 160 on floor 1911. This is done through the above-described change box 66 (FIG. 18). This creates greater space for the WLC block on floor 1911 as seen in FIGS. 31 and 32 wherein the MSRA block on floor 1911 now has a head count of 160.

Upon a further review of the adjacencies of the WLC bubble in the bubble diagram 45 in FIG. 31, it then becomes desirable to move the SQL group so that it is directly adjacent to the WLC group. By highlighting the direct connections for the SQL group and the WLC group, it becomes clear that additional groups then need to be moved from building B2 to building B1 so as to maintain the adjacency with the SQL group. FIG. 32 therefore illustrates placement of SQL group on floor 1909 which maintains the adjacency with the WLC group, and then further placement of the SPG group on floor 1910, the STBC group on floor 1909, and a remaining portion of the SQL group on floor 1908. While some of these groups were previously located in building B2 as seen in FIG. 29, movement of the SPG and STBC groups in the same manner as described above relative to FIGS. 29 and 30 allows for quick readjustment of the proposed plan to accommodate the revised floor plan placements of the various groups.

The architectural planning system 10 allows for dynamic transfer and placement of the organizational data 10 onto the floor plans 48 and into the stacking diagram 18 to quickly allow for dynamic and collaborative development of blocking and stacking diagrams 17 and 18, preferably in a single display 28. This system allows for a direct meeting of members of the client organization and the building planner to review the organizational data, blocking diagrams and stacking diagrams, and further allows for quick and dynamic modifications to the blocking and stacking diagrams, for example in response to feedback from the client organization, even on the spot, in front of the client. This also allows for a dynamic and interactive meeting between representatives of the building planner and the client organization to not only review a proposed plan, but also make immediate modifications thereto, present ideas, make instant changes, simulate ideas and finalize the needs of the client organization, possibly reducing the number of further meetings.

The software and process of the invention actively tracks the relationship of the organizational groups as well as the different connections therebetween, which information can be actively taken into account during the planning phase. Generally, the invention provides an improved software tool and process for planning the physical locations of organizational groups within the building space. Further, changes in organizational needs can be readily modified and adapted through direct and dynamic collaboration between these parties.

Figure 33:
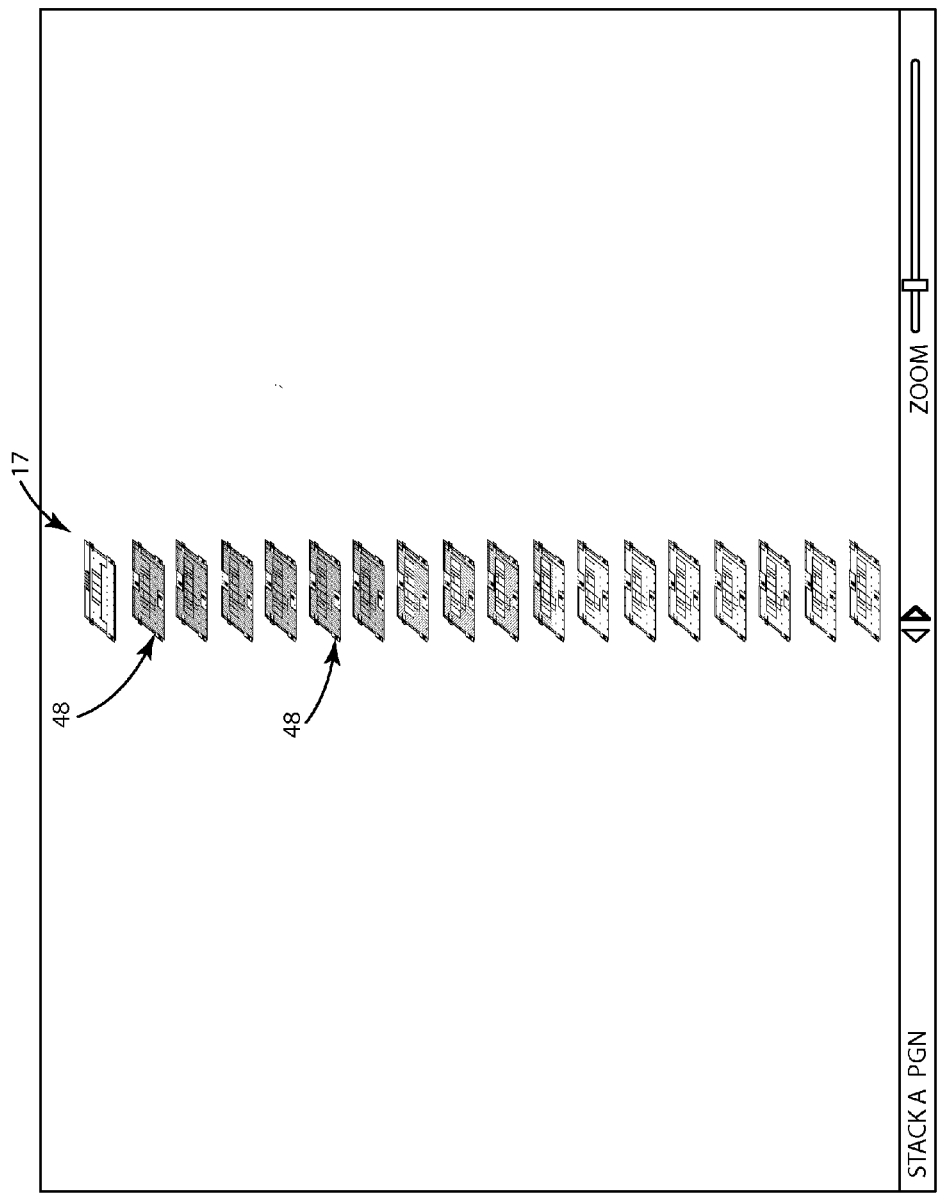
FIG. 33 illustrates one output option for an output simple plane showing a stack of floor plans on an axonometric (such as isometric) view.
Figure 34:
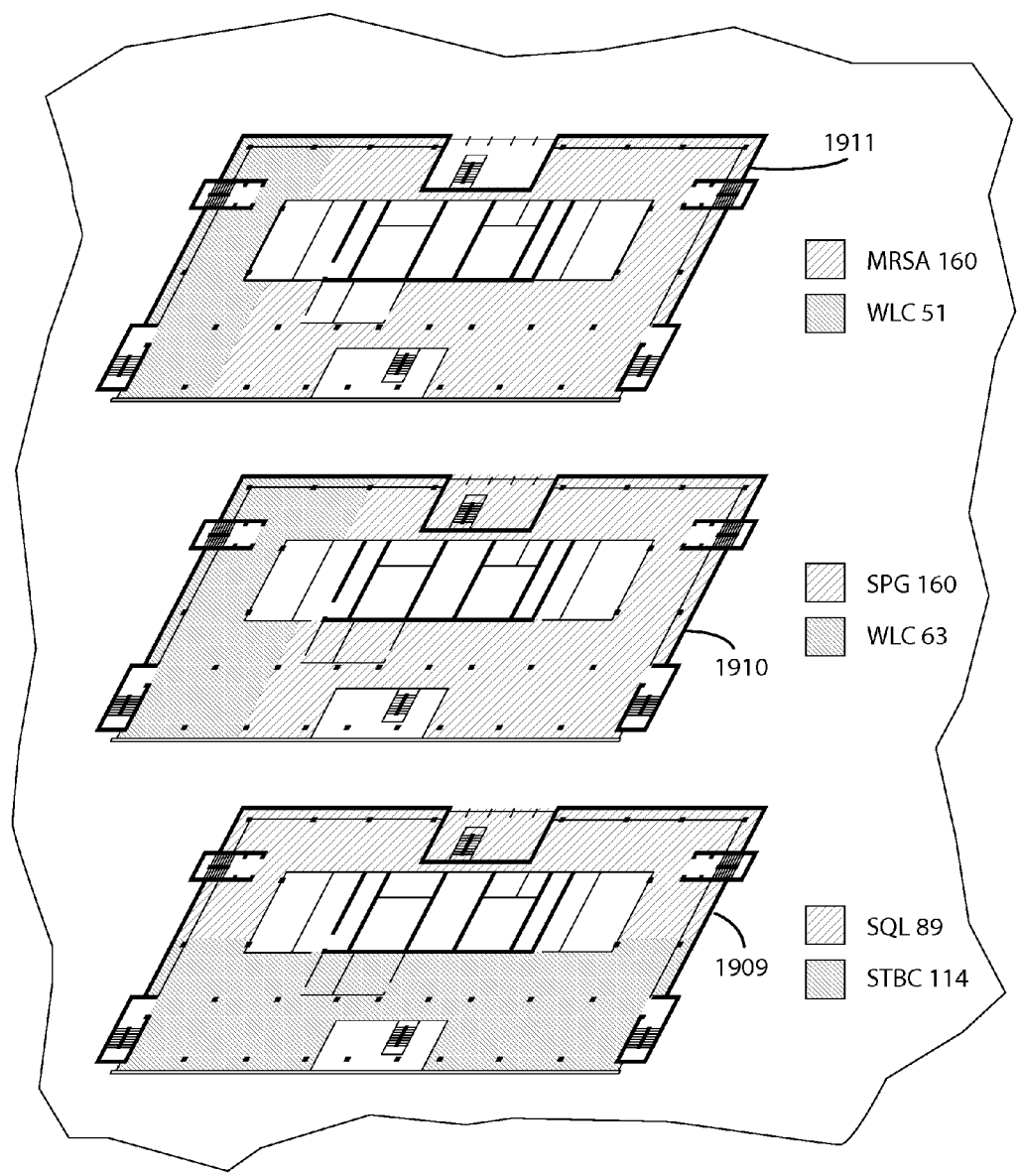
FIG. 34 is an enlarged partial view of FIG. 33.
Figure 35:
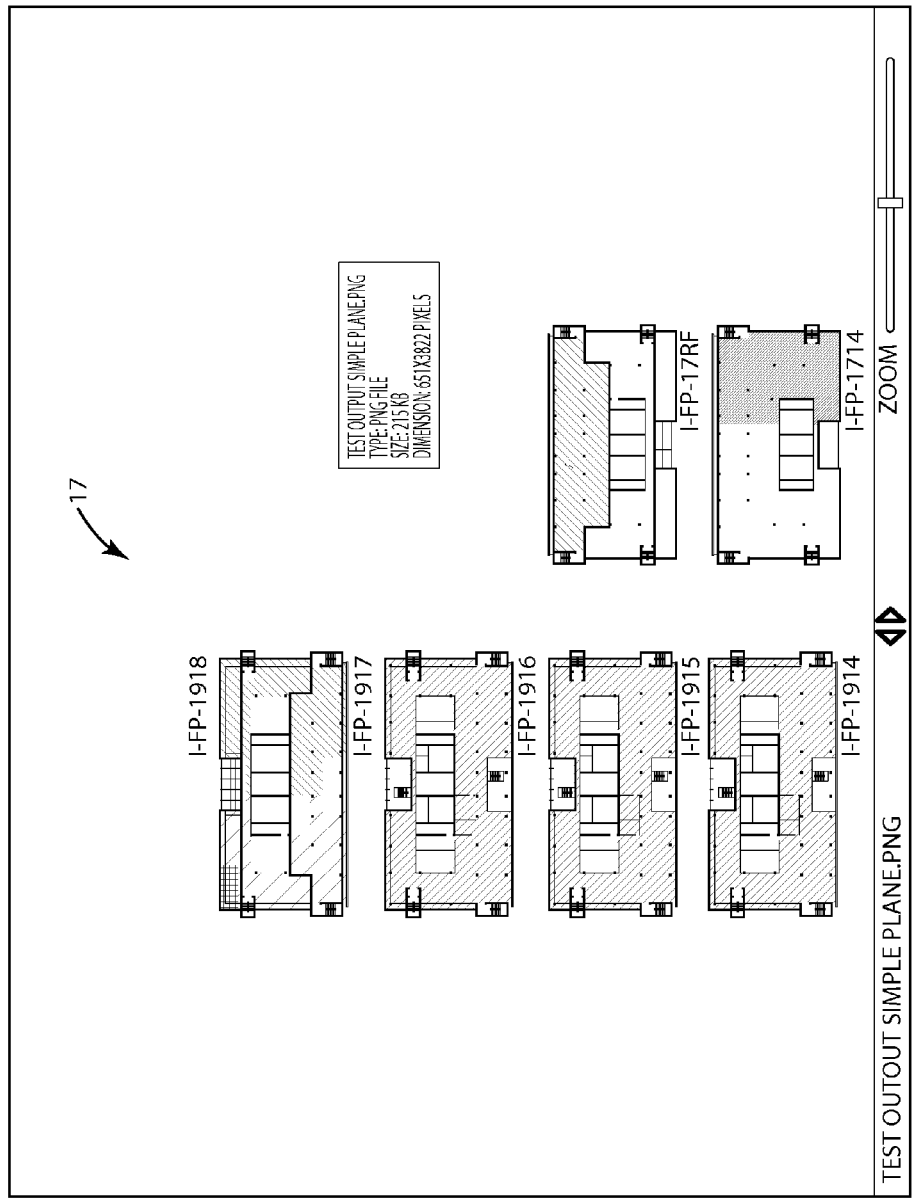
FIG. 35 is a plan view of the floor plans provided as part of the simple plane output.

Once the plan is finalized through this process, the architectural planning system 10 also allows for the generation of outputs from the software 12 to facilitate the interaction with the client organization. In this regard, when either intermediate plans have been developed and are prepared for proposal to the client, or after the final plan is developed, it is possible to click output buttons 90 and 91 (FIGS. 3 and 6) to generate output data. For example, clicking on the output simple plane button 90 generates several output displays as shown in FIGS. 33-35. In particular, FIGS. 33 and 34 illustrate a perspective view of the block diagram 17 showing the individual floors at a perspective viewing angle, one above the other. For example, FIG. 34 illustrates the above-described floors 1909, 1910 and 1911 in an enlarged view which also shows the head count for each of the groups on the right side of the display. For example, floor 1911 has a head count of 160 associated with the MSRA group, and a head count of 51 associated with the WLC group. This is one form of output. FIG. 35 also provides a portion of output which is a flat plan view of the individual floors in a format substantially similar to the block diagram 17. Also, a stacking diagram 18 can be generated as part of the output. Besides the aforementioned outputs of adjacency diagram, blocking diagram, and stacking diagram, which usually are in a picture file format in the form of plan, isometric, axonometric, or some rare cases perspective views, the user can also select to output part of or the entirety of the building being planned back to the CAD or BIM software preferred by the user, either directly, or via a unique (such as .haworth) file format through a pre-installed plug-in. Blocks on floor plans can then be transformed into hatching, zones, spaces, rooms, polylines, or whatever the user preference is in the target application (such as CAD or BIM). In this manner, the invention can readily and quickly allow for adjustments to the building planning and then generate the output for the subsequent proposal steps and finalizing steps for finalizing the building plan. Moreover, user can preferably output adjacency data in the form of a spreadsheet (showing department names, as well as headcount, density and area information, together with connection types and other possible organizational information (such as resources needed, contact person, etc.). Such organizational output can be obtained either for the original (ideal) criteria (part of the input), or for the user—"translated" parameters (as part of the process—such as modified departmental sizes and connections). Finally, a further preferred output is a "smart" file in a platform-independent file format (such as pdf—Portable Document Format) where a plan, isometric, axonometric, or perspective view of the building with all blocking and stacking information is saved. The user then can preferably rotate the view, zoom in and out of different parts and store so-called metadata meshed over blocks/stacks, such as other, department/group-related data obtained from surveys (such as organizational culture, workplace satisfaction, work-styles, etc.)

The layout of the preferred screen of the tool with all of the functions and buttons is explained in great detail above. The skilled artisan will appreciate that this tool may be further modified where desired, such as by making the user interface more user-friendly. This may include re-arranging buttons, deleting buttons, adding new buttons/functions and grouping them, etc.

Currently there are two stages in the system: the bubble diagram stage and the other stage, which can be toggled with the switch stage button, that has 3 main panes: Bubble diagram (preserving the layout from the bubble diagram stage); the Work Characteristics pane (also called the Dashboard) and the third, which contains the blocking and stacking diagrams. It also can be said that the system has four stages, if we count the blocking and stacking diagrams separately. It is also provided that the user can resize panes by grabbing their boundaries and dragging them with the input device.

The system also may include another pane, that replaces the blocking and stacking diagram with one single axonometric (such as isometric) view of the building or buildings, that the user can rotate, tilt, enlarge or shrink with the input device. In this pane, the floor plans would have a three-dimensional appearance positioned one over the other such as in FIG. 34. The user would also preferably be able to store so-called metadata meshed over the blocks/stacks, such as other, department/group-related data obtained from surveys (such as organizational culture, workplace satisfaction, work-styles, etc.). Further, the user would have the option to toggle from current two-dimensional blocking/stacking views to such an axonometric view, and drop bubbles directly here, then being able to rotate the whole building around a vertical axis.

In summary, the main two merits of this architectural planning tool or system is its function as: 1) a communication tool for use between the building planner and a client; and 2) an "error-check," by the fact that the 3 elements of Headcount-Density-Area are interconnected (FIG. 1.), as well as the Adjacency (bubble) Diagram—Blocking diagram—Stacking diagram are also interconnected (FIG. 2.), thus eliminating human errors. For example, for conventional planning systems, one or more departments could inadvertently be left out during the manual process as a result of human error. When this error is recognized, the building may not have enough room for these omitted departments, so the only way to include them in the building plan would be to shrink other departments and force the left-out departments in, which can result in an over-dense, unpleasant work environment. Using the inventive planning system, this could simply not happen, as bubbles change colors as they are being dropped down. In another example, one department might have two spaces allocated to it through human error which increases space demand that can be very costly. With the inventive planning system, this could not happen, either, because the planner cannot drop down a bubble a second time, after it has been already placed on a floor plan. In a further example, the planner may correctly determine the right headcount of a group, and its density, but miscalculate its area. The inventive system does this automatically as an error-check, eliminating this type of error, too. These features are great help to 1) reduce time and 2) reduce errors, thus reducing costs.

In summary, the invention relates in one aspect to an architectural planning system for use with an organization comprised of multiple organizational groups performing the operations of said organization, the system comprising the steps of:

providing architectural planning software operated by a processor to control a visual display, said processor receiving user input through an input device to vary the display state of said visual display;

evaluating the organization to identify a plurality of organizational groups which make up the organization and which will be located at selected locations within at least one building defined on one or more floors, said organizational groups comprising a plurality of associated personnel who perform the respective operations tasks of said organizational group;

providing input data for use by the processor when operating said architectural planning software, said input data at least comprising initial group data for each of said organizational groups which includes a group title, a head count of the number of personnel associated with each said group and building data including said floor plans for said building workspace to which said organizational groups are to be located;

said group data including an initial density value defined by an initial amount of work area desired for each person of said head count;

diagrammatically displaying a bubble diagram (also called adjacency diagram or adjacency map) on said visual display, said bubble diagram comprising a plurality of visual display bubbles for each of said groups which are displayed separately on said processor-control visual display in separate display locations within said bubble diagram;

generating a blocking diagram of one or more floor plans of available workspace in which said groups may selectively be located;

displaying on said visual display said blocking diagram in an initial display state having said available workspace in an unused visual state;

moving one said group bubble from said display location in said bubble diagram to a further display location on said blocking diagram, wherein said group bubble is positioned within a selected location on a selected said floor plan;

wherein said group bubble transforms into a group block conforming to said floor plan in a desired spatial configuration filling at least a portion of said workspace of said floor plan; and positioning said group bubbles on said floor plan one after the other, said spatial configuration for each said group block being sized according to said head count for said respective organizational group and the work area assigned to each individual of said head count.

Further, the architectural planning system may have additional features: wherein each said floor of said floor plans has a maximum head count, said method including the step of adjusting said spatial configuration of each of said group blocks with said input device to vary said density of said group blocks so as to maintain a total head count on each said floor within said maximum head count; wherein said group block automatically conforms to static building structures within said floor plan through collision detection; and wherein said visual display includes a group characteristics pane displaying information as to an active one of said group blocks or said group bubble.

The architectural planning system may also include the steps of identifying operational connections between said organizational groups and displaying said operational connections between said group bubbles in said bubble diagram; wherein said operational connections are displayed as connector lines between related bubbles; wherein each said group bubble is selectively made active by said input device which changes a connector display state of said connector lines of said active group bubble and each said group bubble related to said active group bubble by said connector lines; wherein said connector display state is a color which changes from an initial color to a highlight color when said group bubble is made active; wherein said identifying step includes the step of identifying different priority levels of said operational connections and displaying different types of said connector lines corresponding to said different priority levels of said operational connections; and wherein said moving step includes the step of selecting said group bubbles dependent upon the priority levels of the operational connections with other said groups.

Also in the architectural planning system, said group block and its corresponding group bubble can be displayed simultaneously in said blocking diagram and said bubble diagram; said group bubble can change from an initial display color to a moved display color after movement to said blocking diagram, said corresponding group block being displayed in said moved display color such that said group bubble and said corresponding group block are color coordinated.

The architectural planning system also can include the steps of identifying operational connections between said organizational groups and displaying said operational connections between said group bubbles in said bubble diagram as connector lines, each said group bubble being selectively made active by said input device which changes a connector display state of said connector lines of said active group bubble and each said group bubble related to said active group bubble by said connector lines, either of said group bubble or said corresponding group block being made active by said input device to highlight said connector lines.

Further, each said floor of said floor plans can have a maximum head count, said method including the step of adjusting said spatial configuration of each of said group blocks with said input device, said method further including the step of displaying a stacking diagram comprising a floor indicator for each said floor which displays a maximum head count and a total head count for the group blocks moved to said floor. Said floor indicator on the stacking diagram can proportionally display the total head count as a color corresponding to a display color of said group block.

In another aspect of the invention, an architectural planning system is provided for use with an organization comprised of multiple organizational groups performing the operations of said organization, the system comprising:

architectural planning software operated by a processor and an input device to control a visual display, said processor receiving user input through said input device to vary the display state of said visual display;

said planning system being usable for an organization which comprises a plurality of organizational groups which make up the organization and which will be located at selected locations within a building workspace defined on one or more floors in one or more buildings, said organizational groups comprising a plurality of associated personnel who perform the respective operational tasks of said organizational group;

said processor receiving input data at least comprising initial group data for each of said organizational groups which includes a group title, a head count of the number of personnel associated with each said group and building data including said floor plans for said building workspace to which said organizational groups are to be located;

said group data including an initial density value defined by an initial amount of work area desired for each person of said head count;

said visual display diagrammatically displaying a bubble diagram, said bubble diagram comprising a plurality of visual display bubbles for each of said groups which are displayed separately on said processor-controlled visual display in separate display locations within said bubble diagram;

said visual display further displaying a blocking diagram of one or more floor plans of available workspace in which said groups may selectively be located;

said blocking diagram being displayed on said visual display in an initial display state having said available workspace in an unused visual state;

said group bubble being selectively movable by said input device from said display location in said bubble diagram to a further display location on said blocking diagram, wherein said group bubble is positioned within a selected location on a selected said floor plan;

wherein said group bubble transforms into a group block conforming to said floor plan in a desired spatial configuration filling at least a portion of said workspace of said floor plan; and said group bubbles being selectively positionable on said floor plan one after the other, said spatial configuration for each said group block being sized according to said head count for said respective organizational group based on the work area assigned to each individual of said head count.

Also, in this architectural planning system, each said floor of said floor plans can have a maximum head count, said spatial configuration of each of said group blocks being adjustable with said input device to vary said density of said group blocks so as to maintain a total head count on each said floor within said maximum head count, said group block automatically conforming to static building structures within said floor plan. Said organization groups have operational connections which are displayed as connectors between said group bubbles in said bubble diagram, each said group bubble being selectively made active by said input device which changes a connector display state of said connector lines of said active group bubble and each said group bubble related to said active group bubble by said connector lines, said connector display state being a color which changes from an initial color to a highlight color when said group bubble is made active. Said operational connections are differentiated by priority levels which are displayed as different types of said connector lines on said bubble diagram so that moving said group bubbles to said blocking diagram can be performed dependent upon the priority levels of the operational connections with other said groups. Also, said group block and its corresponding group bubble can be displayed simultaneously in said blocking diagram and said bubble diagram, said group bubble being changeable from an initial display color to a moved display color after movement to said blocking diagram, said corresponding group block being displayed in said moved display color such that said group bubble and said corresponding group block are color coordinated. Each said floor of said floor plans has a maximum head count, said spatial configuration of each of said group blocks being adjustable with said input device to vary said density of said group blocks so as to maintain a total head count on each said floor within said maximum head count, said visual display selectively displaying a stacking diagram comprising a floor indicator for each said floor which displays a maximum head count and a total head count for the group blocks moved to said floor, said floor indicator proportionally displaying the total head count as a color corresponding to a display color of said group block.

Although a particular preferred embodiment of the invention has been disclosed in detail for illustrative purposes, it will be recognized that variations or modifications of the disclosed apparatus, including the rearrangement of parts, lie within the scope of the present invention.

What is claimed is:

1. An architectural planning method for use with an organization comprised of multiple organizational groups performing the operations of said organization, the method comprising the steps of:
   controlling a display state of a visual display based on user input received through an input device;
   storing, in memory, input data based on an evaluation of the organization to identify a plurality of organizational groups which make up the organization and which will be located at selected locations within at least one building defined on one or more floors corresponding to the building space to be outfitted with furniture, said organizational groups comprising a plurality of associated personnel who perform the respective operations tasks of said organizational group, wherein the input data stored in the memory at least includes initial group data for each of said organizational groups and building data, wherein the initial group data includes a group title, a head count of the number of personnel associated with each said group and building data, wherein the building data includes the floor plans for the building workspace to which said organizational groups are to be located;
   generating, using a planning processor, a planning interface configured to receive user input and to control the visual state of the display, wherein the planning interface controls the visual state of the display based at least in part on the user input and the input data stored in the memory;
   wherein said group data includes an initial density value defined by an initial amount of work area desired for each person of said head count;
   generating a bubble diagram, with the planning interface, based on the initial group data, and diagrammatically displaying, with the planning interface, the bubble diagram (also called adjacency diagram or adjacency map) on said visual display, wherein said bubble diagram includes a plurality of visual display bubbles for each of said groups which are displayed separately on the visual display in separate display locations within said bubble diagram, the plurality of visual bubbles being associated with a furniture requirement for each of the groups, wherein said generating the bubble diagram includes calculating bounds for each of said plurality of visual bubbles based on the initial group data;
   generating a blocking diagram, with the planning interface, based on the building data, wherein the blocking diagram is one or more floor plans of available workspace in which said groups may selectively be located;
   controlling, by the planning interface, a display on said visual display to show said blocking diagram in an initial display state having said available workspace in an unused visual state;
   moving, based on the user input received by the planning interface, one said group bubble from said display location in said bubble diagram to a further display location on said blocking diagram, wherein said group bubble is positioned within a selected location on a selected said floor plan;
   based on positioning of the group bubble within the selected location by the planning interface, calculating bounds for a group block to be positioned in an area of the floor plan corresponding to the selected location, wherein the bounds of the group block are calculated based on the initial group data associated with the group bubble;

in response to placement of the group bubble at or near the selected location, automatically visually transforming the group visual bubble into the group block by automatically filling the area of the floor plan according to the calculated bounds of the group block such that the group block conforms to the floor plan in a desired spatial configuration that fills at least a portion of said workspace of said floor plan, the group block indicating a group furniture plan to outfit the desired spatial configuration with furniture based at least in part on the furniture requirement associated with the group visual bubble; and positioning, based on the user input received by the planning interface, said group visual display bubbles on said floor plan one after the other, said spatial configuration for each said group block being sized according to said head count for said respective organizational group and the work area assigned to each individual of said head count.

2. An architectural planning method according to claim 1, wherein each said floor of said floor plans has a maximum head count, said method including the step of adjusting said spatial configuration of each of said group blocks with said input device to vary said density of said group blocks so as to maintain a total head count on each said floor within said maximum head count.

3. An architectural planning method according to claim 2, wherein said group block automatically conforms to static building structures within said floor plan through collision detection.

4. An architectural planning method according to claim 3, wherein said visual display includes a group characteristics pane displaying information as to an active one of said group blocks or said group visual display bubble.

5. An architectural planning method according to claim 1, including the steps of identifying operational connections between said organizational groups and displaying said operational connections between said group visual display bubbles in said bubble diagram.

6. An architectural planning method according to claim 5, wherein said operational connections are displayed as connector lines between related group visual display bubbles.

7. An architectural planning method according to claim 6, wherein each said group visual display bubble is selectively made active by said input device which changes a connector display state of said connector lines of said active group visual display bubble and each said group visual display bubble related to said active group bubble by said connector lines.

8. An architectural planning method according to claim 7, wherein said connector display state is a color which changes from an initial color to a highlight color when said group visual display bubble is made active.

9. An architectural planning method according to claim 6, wherein said identifying step includes the step of identifying different priority levels of said operational connections and displaying different types of said connector lines corresponding to said different priority levels of said operational connections.

10. An architectural planning method according to claim 9, wherein said moving step includes the step of selecting said group visual display bubbles dependent upon the priority levels of the operational connections with other said groups.

11. An architectural planning method according to claim 1, wherein each said group block and its corresponding group visual display bubble are displayed simultaneously in said blocking diagram and said bubble diagram.

12. An architectural planning method according to claim 11, wherein said group visual display bubble changes from an initial display color to a moved display color after movement to said blocking diagram, said corresponding group block being displayed in said moved display color such that said moved group visual display bubble and said corresponding group block are color coordinated.

13. An architectural planning method according to claim 12, the steps of identifying operational connections between said organizational groups and displaying said operational connections between said group visual display bubbles in said bubble diagram as connector lines, each said group visual display bubble being selectively made active by said input device which changes a connector display state of said connector lines of said active group visual display bubble and each said group visual display bubble related to said active group visual display bubble by said connector lines, either of said group visual display bubble or said corresponding group block being made active by said input device to highlight said connector lines.

14. An architectural planning method according to claim 1, wherein each said floor of said floor plans can have a maximum head count, said method including the step of adjusting said spatial configuration of each of said group blocks with said input device, said method further including the step of displaying a stacking diagram comprising a floor indicator for each said floor which displays a maximum head count and a total head count for the group blocks moved to said floor.

15. An architectural planning method according to claim 14, wherein said floor indicator on the stacking diagram proportionally displays the total head count as a color corresponding to a display color of said group block.

16. An architectural planning system for use with an organization comprised of multiple organizational groups performing the operations of said organization, the system comprising:

a display controller configured to control a visual display based on user input received from an input device, said display controller configured to vary a display state of said visual display;

a planning interface in communication with said display controller, said planning interface configured to receive the user input from the input device to generate a plan to outfit a building space with furniture, said plan being communicated to said display controller for display on the visual display, said plan being adapted for an organization which comprises a plurality of organizational groups which make up the organization and which will be located at selected locations within a building workspace defined on one or more floors in one or more buildings corresponding to said building space, said organizational groups comprising a plurality of associated personnel who perform the respective operational tasks of said organizational group;

said planning interface configured to receive input data at least comprising initial group data for each of said organizational groups which includes a group title, a head count of the number of personnel associated with each said group and building data including said floor plans for said building workspace to which said organizational groups are to be located;

wherein said group data includes an initial density value defined by an initial amount of work area desired for each person of said head count;

wherein said display controller is configured to diagrammatically display a bubble diagram based on information received from said planning interface, said bubble diagram being based on the initial group data, said bubble diagram comprising a plurality of visual display bubbles for each of said groups which are displayed separately on said visual display in separate display locations within said bubble diagram, the plurality of visual display bubbles being associated with a furniture requirement for each of said groups, wherein said display controller is configured to calculate bounds for each of said plurality of visual display bubbles based on said group data;

said planning interface configured to communicate with said display controller to display a blocking diagram of one or more floor plans of available workspace in which said groups may selectively be located, wherein the blocking diagram is based on said building data;

wherein said blocking diagram is displayed on said visual display in an initial display state having said available workspace in an unused visual state;

said planning interface controls, based on user input received from the input device, display of said group visual display bubble to selectively move said group visual display bubble from said display location in said bubble diagram to a further display location on said blocking diagram, wherein said group visual display bubble is positionable within a selected location on said floor plan;

wherein, based on selective movement of said group visual display bubble to said blocking diagram, said planning interface calculates bounds for a group block to be positioned in an area of said floor plan corresponding to said selected location, wherein said bounds of said group block are calculated based on said group data associated with said group visual display bubble;

wherein, in response to placement of the group visual display bubble at or near said selected location, said planning interface automatically visually transforms said group visual display bubble into a group block by automatically filling said area of said floor plan according to said calculated bounds of said group block such that said group block conforms to said floor plan in a desired spatial configuration that fills at least a portion of said workspace of said floor plan, wherein the group block indicates a group furniture plan to outfit the desired spatial configuration with furniture based at least in part on the furniture requirement associated with the group visual display bubble; and wherein said planning interface enables selective positioning of said group visual display bubbles on said floor plan one after the other, said spatial configuration for each said group block being sized according to said head count for said respective organizational group based on the work area assigned to each individual of said head count.

17. An architectural planning system according to claim 16, wherein each said floor of said floor plans has a maximum head count, said spatial configuration of each of said group blocks being adjustable with said input device to vary said density of said group blocks so as to maintain a total head count on each said floor within said maximum head count, said group block automatically conforming to static building structures within said floor plan.

18. An architectural planning system according to claim 17, wherein said organization groups have operational connections which are displayed as connectors between said group visual display bubbles in said bubble diagram, each said group visual display bubble being selectively made active by said input device which changes a connector display state of said connector lines of said active group visual display bubble and each said group visual display bubble related to said active group visual display bubble by said connector lines, said connector display state being a color which changes from an initial color to a highlight color when said group visual display bubble is made active.

19. An architectural planning system according to claim 18, wherein said operational connections are differentiated by priority levels which are displayed as different types of said connector lines on said bubble diagram so that moving said group visual display bubbles to said blocking diagram can be performed dependent upon the priority levels of the operational connections with other said groups.

20. An architectural planning system according to claim 19, wherein said group block and its corresponding group visual display bubble are displayed simultaneously in said blocking diagram and said bubble diagram, said group visual display bubble being changeable from an initial display color to a moved display color after movement to said blocking diagram, said corresponding group block being displayed in said moved display color such that said group visual display bubble and said corresponding group block are color coordinated.

21. An architectural planning system according to claim 20, wherein each said floor of said floor plans has a maximum head count, said spatial configuration of each of said group blocks being adjustable with said input device to vary said density of said group blocks so as to maintain a total head count on each said floor within said maximum head count, said visual display selectively displaying a stacking diagram comprising a floor indicator for each said floor which displays a maximum head count and a total head count for the group blocks moved to said floor, said floor indicator proportionally displaying the total head count as a color corresponding to a display color of said group block.

22. An architectural planning system for use with an organization comprised of multiple organizational groups performing operations of said organization, the organization including a plurality of individuals that work within the organization, the system comprising:

a display controller configured to control a visual display to display a blocking diagram representative of a building workspace that includes one or more floors in one or more buildings, said display controller configured to diagrammatically display a bubble diagram formed of a plurality of visual display bubbles;

a planning interface in communication with said display controller, said planning interface configured to communicate display information to said display controller to affect display of said blocking diagram and said bubble diagram, said planning interface configured to receive organization information related to a plurality of organizational groups of the organization, wherein each of the plurality of organizational groups is scheduled to be located within the building workspace, wherein each of the plurality of individuals is associated with at least one of the plurality of organizational groups;

wherein, based on said display information communicated to said display controller from said planning interface, said display controller displays a group visual display bubble for each of the plurality of organizational groups, wherein bounds are calculated for said group visual display bubble for each of the plurality of organizational groups;

said planning interface configured to receive user input from a user via a user device, said planning interface configured to enable the user to select at least one group visual display bubble, wherein said at least one group visual display bubble that is selected by the user is selectively placeable on said blocking diagram by the user via said user input received by said planning interface;

wherein said planning interface is configured to communicate display information to said display controller to place, on said blocking diagram, said at least one group visual display bubble selected by the user, wherein based on placement of said at least one group visual display bubble at a selected location of said blocking diagram, said planning interface calculates bounds for at least one group block corresponding to an area of said blocking diagram associated with said selected location;

wherein, in response to selective placement of said at least one group visual display bubble at said selected location on said blocking diagram, said display controller automatically visually transforms said at least one group visual display bubble into said at least one group block by automatically filling said area of said blocking diagram according to said calculated bounds for said at least one group block such that said at least one group block conforms to said blocking diagram to fill at least a portion of the workspace corresponding to a group space, wherein the group block indicates a furniture plan to outfit said group space with furniture for the organizational group associated with each of said at least one group blocks; and wherein said planning interface is configured to enable successive placement of a plurality of said group visual display bubbles on said blocking diagram.

23. The architectural planning system of claim 22 wherein the organizational information includes initial group data for each of said organizational groups, said initial group data including a group title and a head count of a number of personnel, said organizational information including building data with floor plans for said building workspace;

wherein said initial group data includes an initial density value defined by an initial amount of work area desired for each person of said head count.

* * * * *